US005619103A

United States Patent [19]
Tobin et al.

[11] Patent Number: 5,619,103
[45] Date of Patent: Apr. 8, 1997

[54] INDUCTIVELY COUPLED PLASMA GENERATING DEVICES

[75] Inventors: Jeffrey A. Tobin, Santa Fe, N.M.; Guifang Li, Rochester, N.Y.

[73] Assignee: Wisconsin Alumni Research Foundation, Madison, Wis.

[21] Appl. No.: 486,917

[22] Filed: Jun. 7, 1995

Related U.S. Application Data

[62] Division of Ser. No. 146,703, Nov. 2, 1993, abandoned.

[51] Int. Cl.$^6$ .................................................... H01J 7/24
[52] U.S. Cl. ............................ 315/111.21; 315/111.51; 204/298.08
[58] Field of Search .......................... 315/111.21, 111.41, 315/111.51, 248; 219/121.52, 121.43; 156/345, 643; 204/298.08

[56] References Cited

U.S. PATENT DOCUMENTS

| | | | |
|---|---|---|---|
| 966,240 | 8/1910 | Hewitt . | |
| 2,030,957 | 2/1936 | Bethenod et al. | 315/248 |
| 2,118,451 | 5/1938 | LeBel | 315/248 |
| 3,500,118 | 3/1970 | Anderson | 315/57 |
| 3,763,392 | 10/1973 | Hollister | 315/248 |
| 3,873,884 | 3/1975 | Gabriel | 315/267 |
| 3,909,736 | 9/1975 | Huchital et al. | 372/171 |
| 4,032,862 | 6/1977 | Huchital et al. | 315/248 |
| 4,266,166 | 5/1981 | Proud et al. | 315/248 |
| 4,266,167 | 5/1981 | Proud et al. | 315/248 |
| 4,864,194 | 9/1989 | Kobayashi et al. | 315/248 |
| 4,894,591 | 1/1990 | Whitting | 315/248 |
| 4,922,157 | 5/1990 | Van Engen et al. | 315/248 |
| 4,940,921 | 7/1990 | Helling et al. | 315/219 |
| 4,940,923 | 7/1990 | Kroontje et al. | 315/248 |
| 4,948,458 | 8/1990 | Ogle | 156/643 |
| 4,977,354 | 12/1990 | Bergervoet et al. | 315/248 |
| 4,982,140 | 1/1991 | Witting | 315/248 |
| 5,006,752 | 4/1991 | Eggink et al. | 313/161 |
| 5,006,763 | 4/1991 | Anderson | 315/248 |
| 5,013,966 | 5/1991 | Saikatsu et al. | 313/493 |
| 5,019,750 | 5/1991 | Godyak | 315/248 |
| 5,023,566 | 6/1991 | El-Hamamsy et al. | 330/251 |
| 5,039,903 | 8/1991 | Farrall | 315/112 |
| 5,042,139 | 8/1991 | Farrall | 315/248 |
| 5,047,692 | 9/1991 | Borowiec et al | 315/248 |
| 5,047,693 | 9/1991 | Roberts et al. | 315/248 |
| 5,059,868 | 10/1991 | El-Hamasy et al. | 315/248 |
| 5,063,332 | 11/1991 | El-Hamamsy et al. | 315/248 |
| 5,070,273 | 12/1991 | van den Bogert et al. | 313/607 |
| 5,084,654 | 1/1992 | El-Hamamsy et al. | 315/248 |
| 5,103,140 | 4/1992 | Cocoma et al. | 315/248 |
| 5,105,122 | 4/1992 | Konings et al. | 313/487 |
| 5,107,185 | 4/1992 | El-Hamamsy et al. | 315/248 |
| 5,226,967 | 7/1993 | Chen et al. | 156/345 |
| 5,231,334 | 7/1993 | Paranjpe | 315/111.21 |
| 5,280,154 | 1/1994 | Cuomo et al. | 219/121.52 |
| 5,309,063 | 5/1994 | Singh | 315/111.51 |
| 5,349,271 | 9/1994 | van Os et al. | 315/248 |

OTHER PUBLICATIONS

Langmuir probe measurements of an RF induction plasma, J. Hopwood, et al., IBM Thomas J. Watson Research Center, JJ 1991 38th National Symposium of the American Vacuum Society (Seattle WA 11–15 Nov. 1991) (unpublished).

*Primary Examiner*—Robert Pascal
*Assistant Examiner*—Haissa Philogene
*Attorney, Agent, or Firm*—Schwegman, Lundberg, Woessner & Kluth, P.A.

[57] ABSTRACT

A broad area plasma lighting device in which a sealed gas envelope placed adjacent to a planar inductive coupling structure generates visible light. Representative planar inductive coupling structures include a planar spiral coil and a parallel conductor coupling structure. According to the invention, a parallel conductor coupling structure has two basic forms: separate parallel conductors each driven by its own generator/tuning circuit, or single conductor such as a flattened helix or series of square coils driven by one generator/tuning circuit. In addition, a plasma generating device having one or more parallel conductor inductive coupling structures is described. The resulting plasma generator can be used in such applications as plasma processing and inductive plasma lighting.

6 Claims, 25 Drawing Sheets

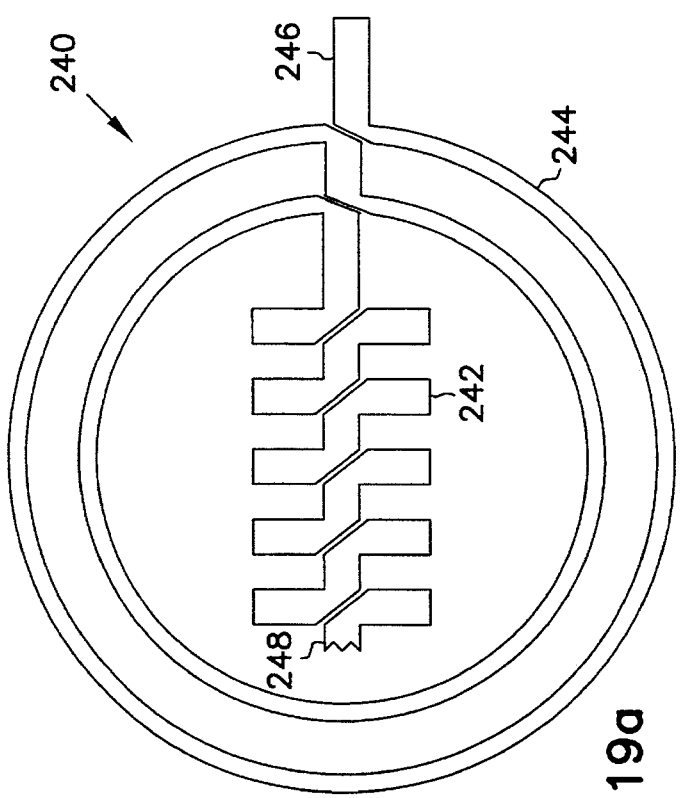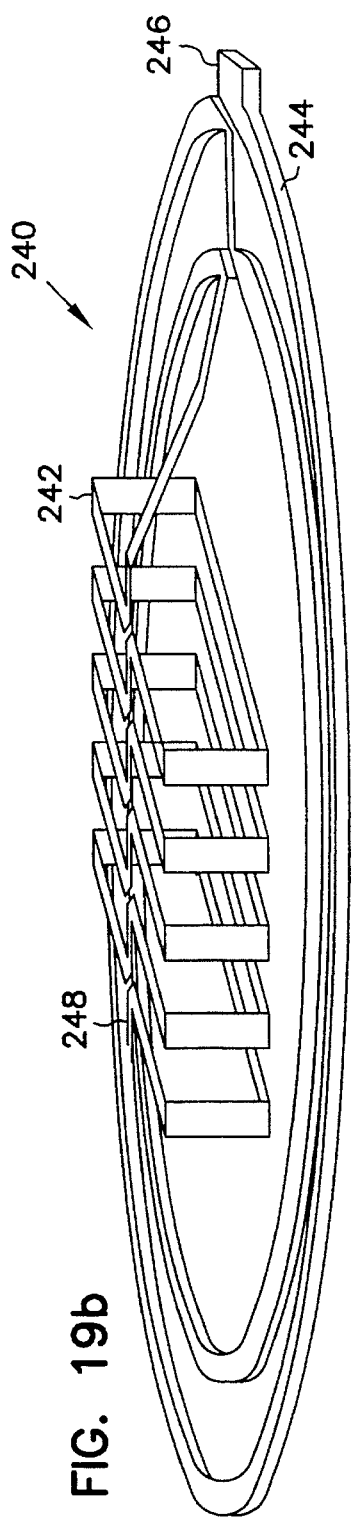
FIG. 19a
FIG. 19b

INDUCTIVELY COUPLED PLASMA GENERATING DEVICES

This is a division of application Ser. No. 08/146,743, filed Nov. 2, 1993 now abandoned.

FIELD OF THE INVENTION

The present invention pertains generally to the field of inductively coupled plasmas, and more particularly to the use of planar inductive coupling structures to form broad area, substantially uniform plasmas.

BACKGROUND OF THE INVENTION

Inductively coupled plasmas work on the principal of producing an electric field in a body of gas via the magnetic fields produced by an oscillating current in the vicinity of the gas. When the fields induced in the gas are strong enough, the gas can break down and become ionized, resulting in what is commonly known as a glow discharge or plasma. Such plasmas have been used for a number of applications ranging from fluorescent lighting to plasma treatment of semiconductor wafers. In fluorescent lighting, a plasma induced within a lamp envelope generates many spectral components of light, the spectral components each occupying a narrow wavelength range and the spectral components occurring over a wide range of wavelengths depending on the gas in the lamp envelope. In many gases, a large portion of the spectral components can occur in the ultraviolet region. For the typical fluorescent lighting device, the ultraviolet light is converted to visible light by placing a phosphor coating on the lamp envelope. In semiconductor fabrication, plasmas provide the ions and other reactive gases used in semiconductor fabrication processes such as etching, resist stripping, passivation and deposition.

Traditionally, inductively coupled plasmas have been created by either wrapping a solenoidal coil around a glass or quartz tube containing a gas ("helical induction") or by placing such a coil within the volume of gas itself ("immersed induction"). In a typical approach, an RLC circuit created by the inductive coil and a matching circuit is tuned to resonance to develop high currents on the coil. An alternating magnetic field induced within the gas volume creates a conductive plasma discharge having characteristics like the secondary winding of a transformer, with a portion of the current through the discharge being converted to light. Lighting devices implemented using helical induction and others using immersed induction are described in U.S. Pat. No. 966,204, issued Aug. 2, 1910 to Hewitt.

A different approach to generating an inductively coupled plasma is described in U.S. Pat. No. 4,948,458, issued Aug. 14, 1990 to Ogle. Ogle teaches placing a planar spiral conductor proximate a gas-filled chamber. According to Ogle, a radiofrequency resonant current induced in the spiral conductor produces a planar magnetic field within the chamber. The resulting broad area plasma can be used to treat semiconductor wafers placed within the chamber. Hopwood, in "Review of Inductively Coupled Plasmas for Plasma Processing," published in Plasma Sources Science Technology in 1992, states that the diameter of a spiral-coupled inductively coupled plasma may be increased simply by increasing the diameter of the spiral coil. The result is a fairly uniform plasma which covers a large, planar area.

According to Ogle, the planar spiral inductive element should be placed on a planar dielectric surface through which it couples to a low pressure (0.1 mT to 5 Torr is claimed) gas. (According to Hopwood, the dielectric acts to reduce the effects of capacitive coupling between the coil and the plasma.) In the device taught by Ogle, the dielectric is a part of the chamber and, as such, it bears the load of the vacuum in separating the inductive coil from the low pressure gas. This becomes important when the plasma generator is scaled to larger coil sizes requiring larger, and hence thicker, dielectrics to bear the pressure differential.

Ogle teaches that the broad area plasma formed by driving the spiral coil in proximity to the chamber is useful for controlling etching and other ion-intensive semiconductor fabrication processes. At the same time, however, the planar spiral conductor is limited in its ability to adapt to different types of plasma generator applications and is still susceptible to irregularities in the plasma due to capacitive coupling between the spiral conductor and the gas. Finally, Ogle makes no provision for shielding the generator to prevent emissions of electromagnetic interference (EMI). There is a need in the art for a method of generating a uniform broad area plasma which is both flexible, adaptable to a variety of conditions and which addresses the above concerns regarding capacitive coupling and EMI.

SUMMARY OF THE INVENTION

To overcome limitations in the art described above and to overcome other limitations that will become apparent upon reading and understanding the present specification, the present invention provides a plasma generating device having one or more parallel conductor inductive coupling structures. The parallel conductor coupling structure has two basic forms: separate parallel conductors each driven by its own generator/tuning circuit, or single conductor such as a flattened helix or series of square coils driven by one generator/tuning circuit. The resulting plasma generator can be used in such applications as plasma processing and inductive plasma lighting.

In another aspect of the present invention, a broad area plasma lighting device is described in which a sealed gas envelope is placed adjacent to a planar inductive coupling structure. Representative planar inductive coupling structures include the parallel conductor coupling structure described above and the planar spiral coil described by Ogle. A phosphor coating on the inside of the gas envelope increases the visible light output.

In yet another aspect of the present invention, a method of reducing capacitive coupling between a planar inductive coupling structure such as a spiral coil or parallel conductor structure is described in which a Faraday shield is inserted between the inductive coupling structure and the plasma.

In yet another aspect of the present invention a method of tuning the impedance matching circuit is described in which an annular disk capacitor plate is inserted between the coupling structure and the device housing in order to be used as one plate of both the tuning and load capacitors.

The novel features which characterize the invention are outlined in detail in the following drawings and descriptions.

DESCRIPTION OF THE DRAWINGS

In the drawings, where like numerals refer to like, elements throughout the several views;

FIG. 1a illustrates a transformer model of inductively coupled plasmas;

FIGS. 19a and 19b are top and iso views respectively of a hybrid planar inductive coupling structure formed by combining a parallel conductor inductive coupling structure with a portion of a spiral coil;

DETAILED DESCRIPTION OF THE DRAWINGS

In the following detailed description of the Drawings, reference is made to the accompanying drawings which form a part hereof, and in which is shown by way of illustration a specific embodiment in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

In general, to produce an inductive plasma, a device must contain an oscillating power generator, an inductive coupling structure and a gas to which the structure can inductively couple. A transformer model representative of inductively couple plasmas is illustrated generally in FIG. 1a. In FIG. 1a, inductively coupled plasma generator 10 consists of an RF source 12 connected through an impedance matching circuit 14 to an inductive coupling structure 16.

Impedance matching circuit 14, although usually needed, is not always needed. For instance, as inductively coupled devices get larger, the frequencies used to generate the plasma might drop. At lower frequencies (e.g., less than 0.5 MHz) a matching circuit 14 is not needed.

Figure 1B:
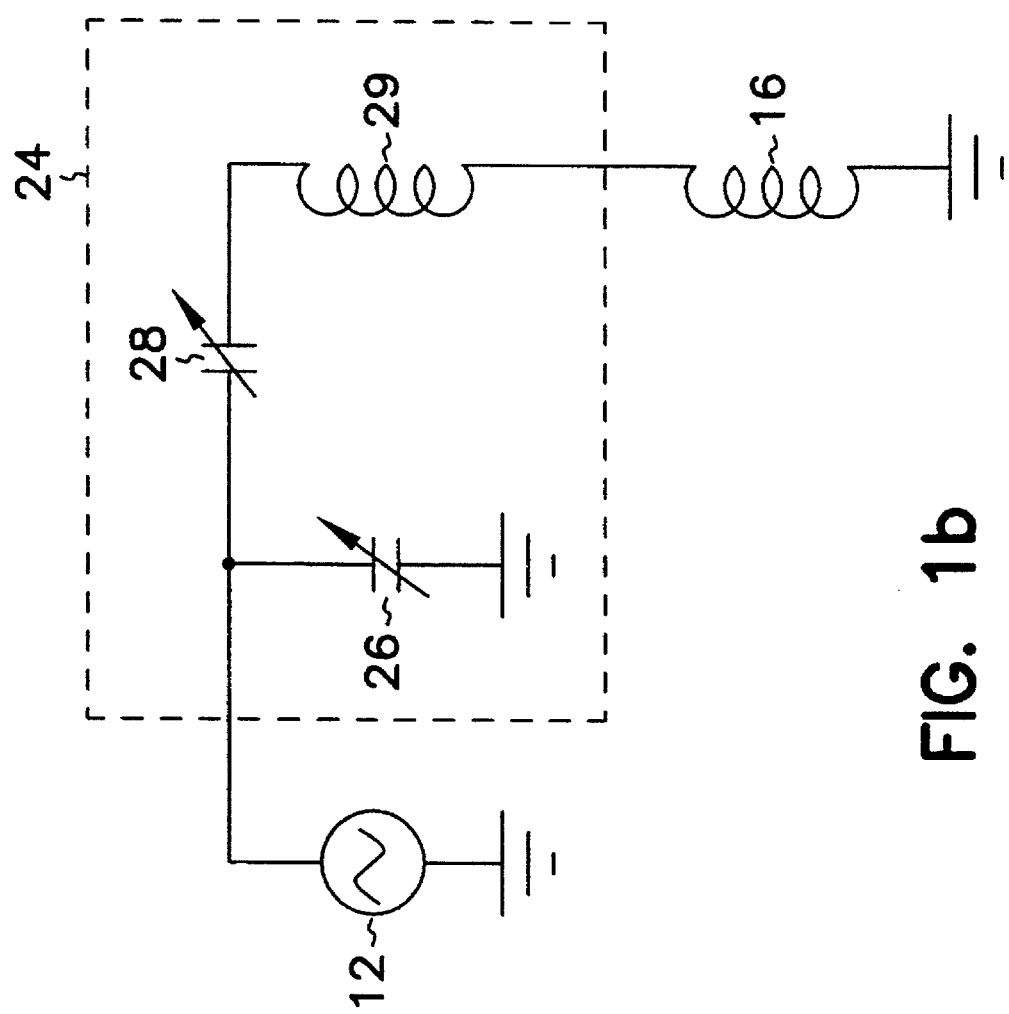
FIG. 1b illustrates one embodiment of an impedance matching circuit.

A plasma is generated by coupling a high frequency signal from RF source 12 through inductive coupling structure 16 to a gas 18. The plasma itself can be modelled as a secondary winding 20 and a series-connected plasma impedance 22. In the preferred embodiment, impedance matching circuit 14 is tuned to resonance in order to develop the high currents required on coupling structure 16 needed to ionize gas 18. In one embodiment, as is shown in FIG. 1b, impedance matching circuit 14 implemented through an L-type network 24 having a load capacitor 26 and a tuning capacitor 28. In such an embodiment, a fixed inductor 29 may be placed in series with tuning capacitor 28. In addition, it may be advantageous to implement capacitors 26 and 28 as variable capacitors as is shown in FIG. 1b.

Figure 2:
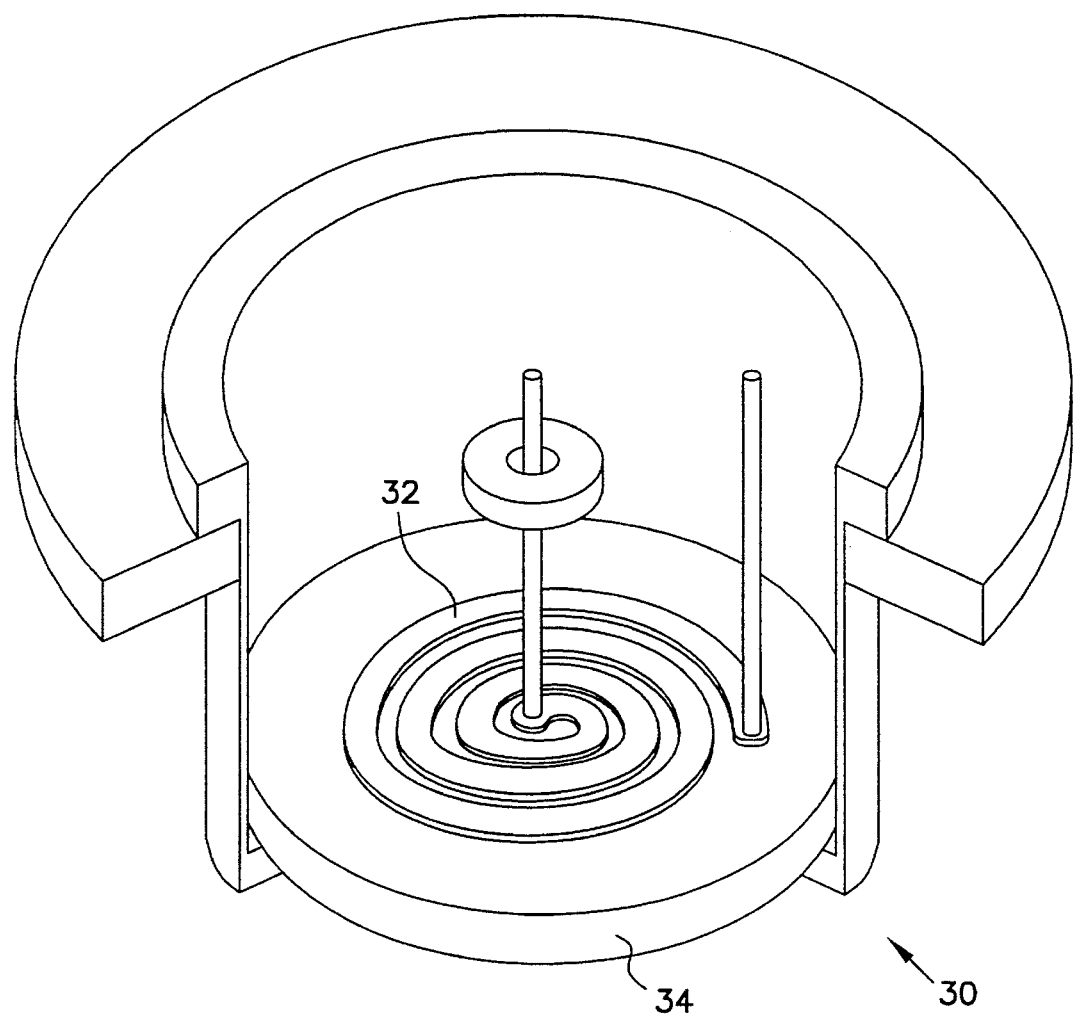
FIG. 2 is a cut away view of an inductively coupled plasma generator.

As in Ogle, described in the Background of the Invention above, plasma generating device 10 may also contain a dielectric medium through which the fields can inductively couple to the gas. One embodiment of such an inductively coupled plasma generator 30 is shown generally in FIG. 2. In FIG. 2, plasma generator 30 contains a planar spiral coil 32 coupled through a dielectric medium 34 to a gas (not shown). As detailed above, dielectric medium 34 acts to reduce capacitive coupling between inductor 32 and the gas.

Figure 3:
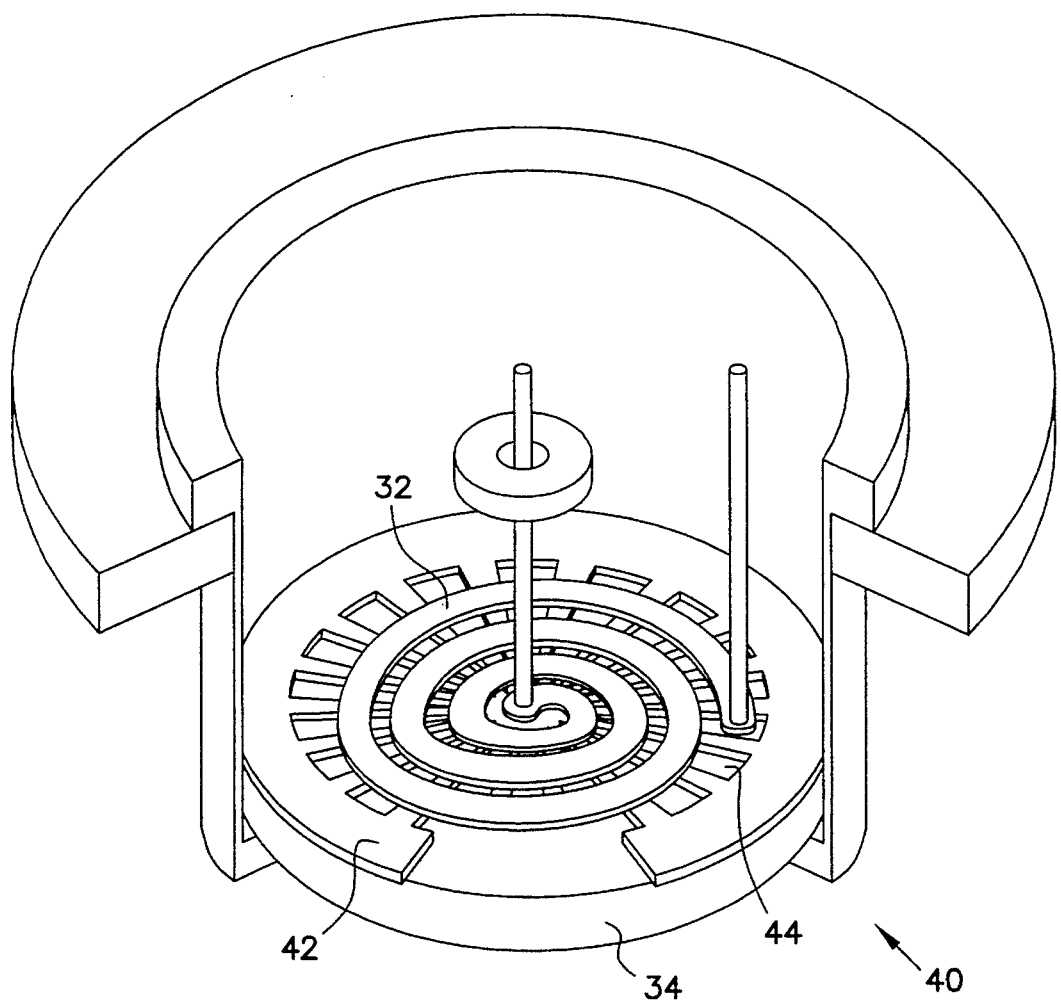
FIG. 3 is a cut away view of a inductively coupled plasma generator having a Faraday shield for reducing capacitive coupling between the planar spiral coil and the plasma.

An improved embodiment of plasma generator 30 of FIG. 2 is shown generally as plasma generator 40 in FIG. 3. As in FIG. 2, plasma generator 40 contains a planar spiral coil 32 coupled through dielectric medium 34 to a gas (not shown). In addition, however, generator 40 includes a Faraday shield 42 located between inductor 32 and dielectric medium 34. Shield 42 is typically set at the ground potential of generator 40. Its purpose is to block the direct (or capacitive) fields from the plasma region while still allowing the magnetic fields to penetrate. Such an approach is also useful for reducing the amount of electromagnetic interference (EMI) that is radiated from the device.

A second EMI shield can also be included as a housing for the coil and tuning circuitry in order to further reduce EMI emissions. In one embodiment slots 44 are added to shield 42 or to the second EMI shield to prevent the circulation of eddy currents induced by coil 32.

Figure 4A:
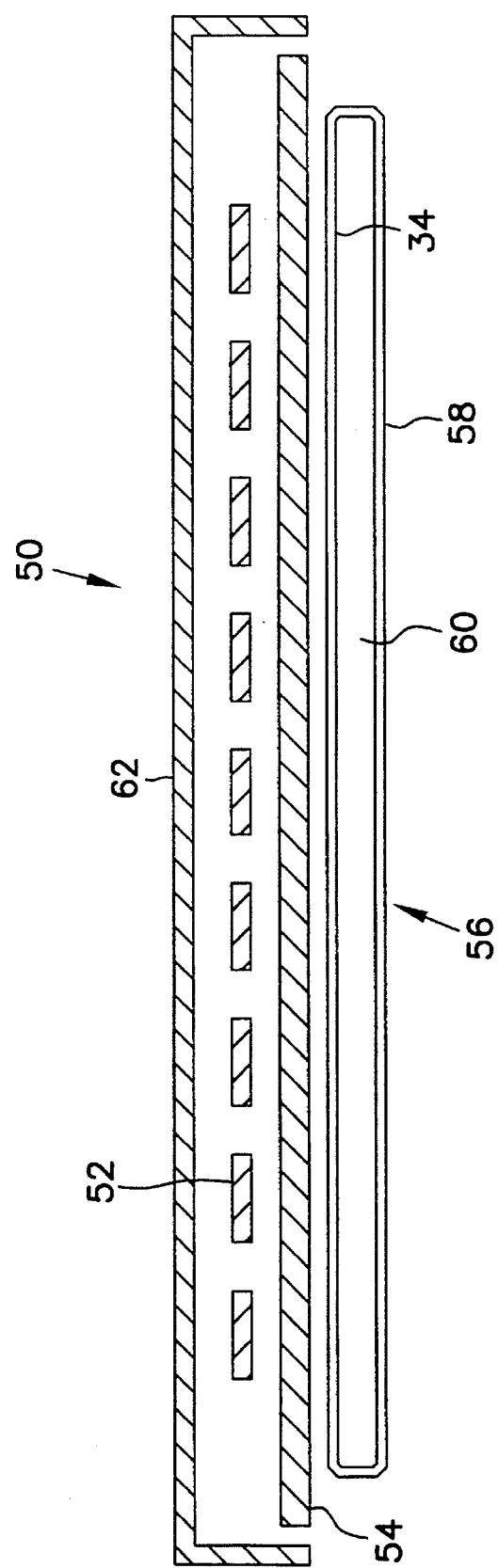
FIGS. 4a and 4b illustrate an electrodeless plasma lighting devices.

A planar inductively coupled plasma generator can be used advantageously to create a broad area plasma lighting device. A side view of one embodiment of such a lighting device 50 is shown in FIG. 4a. In FIG. 4a, inductive coupling structure 52 couples through Faraday shield 54 to a plasma light disk 56, In the embodiment shown EMI shield 62 surrounds coupling structure 52 and is connected, along with shield 54, to ground potential in order to further reduce EMI emissions as described above.

Figure 4B:
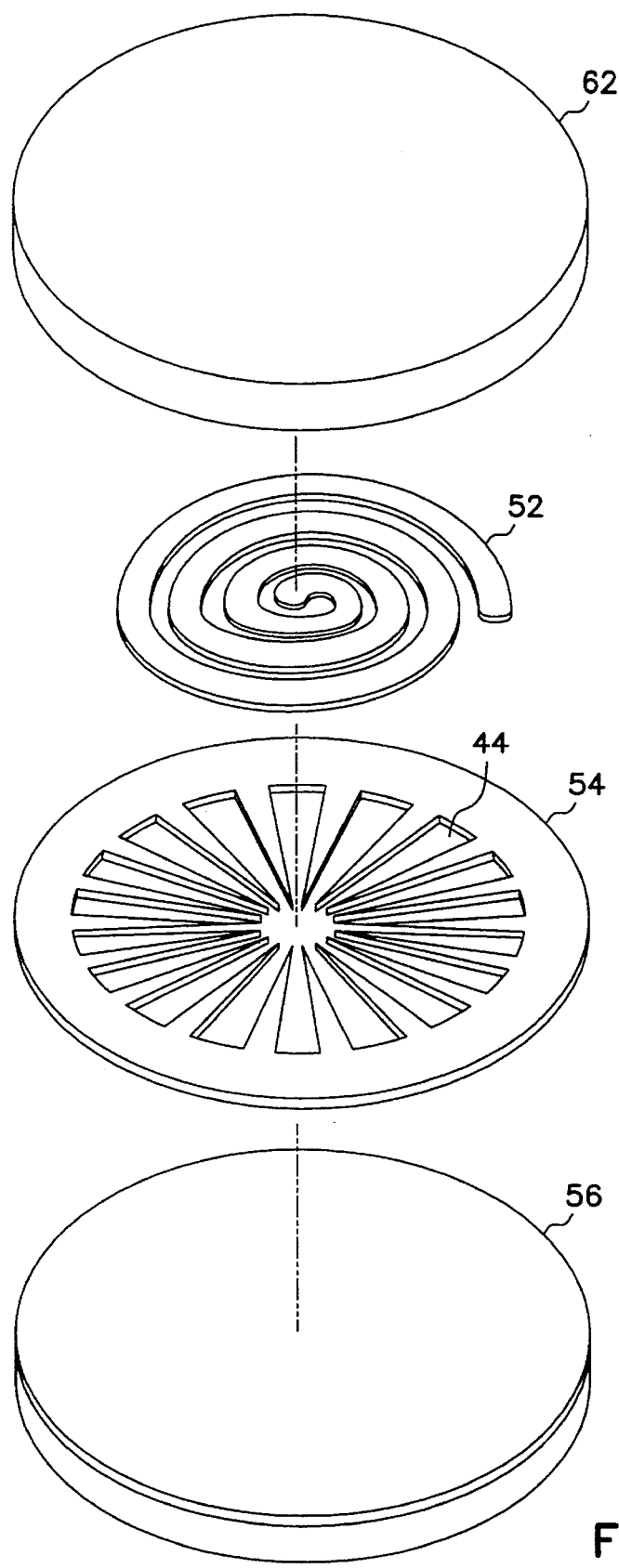

Plasma light disk 56 is a sealed envelope 58 containing a gas 60. In one embodiment, sealed envelope 58 contains a low pressure gas mixture composed of a noble gas such as argon and mercury vapor. Envelope 58 is typically constructed of a dielectric material, with the side of envelope 58 facing structure 52 serving as dielectric medium 34. The radial dimension of dielectric envelope 58 is chosen to be close to that of inductive coupling structure 52. In such an embodiment, it is advantageous to place a fluorescent coating over all or part of the inside wall of envelope 58 in order to transfer energy irradiated from the glow discharge from the short UV wavelengths (which can predominate the radiated emission) to lower frequency visible light. An exploded view of parts of lighting device 50 is illustrated generally in FIG. 4b.

In an alternate embodiment, impedance matching circuit 14 is implemented by incorporating tuning capacitor 28 and load capacitor 26 in the housing of the broad area lighting device. In one such embodiment, the impedance matching circuitry is incorporated into the housing in such a way that the elements of the tuning circuit closely match the shape of the coil and thereby minimize the size of the device. This is done by forming the capacitors from tuning circuit disks or annuli which are of a radius similar to that of the coil. The annular/disk capacitors are then spaced from the coil and each other to produce the desired capacitance. The actual size and spacing will depend on a number of design factors including the frequency, pressure and composition of the gas, housing design, materials, etc.

Figure 5A:
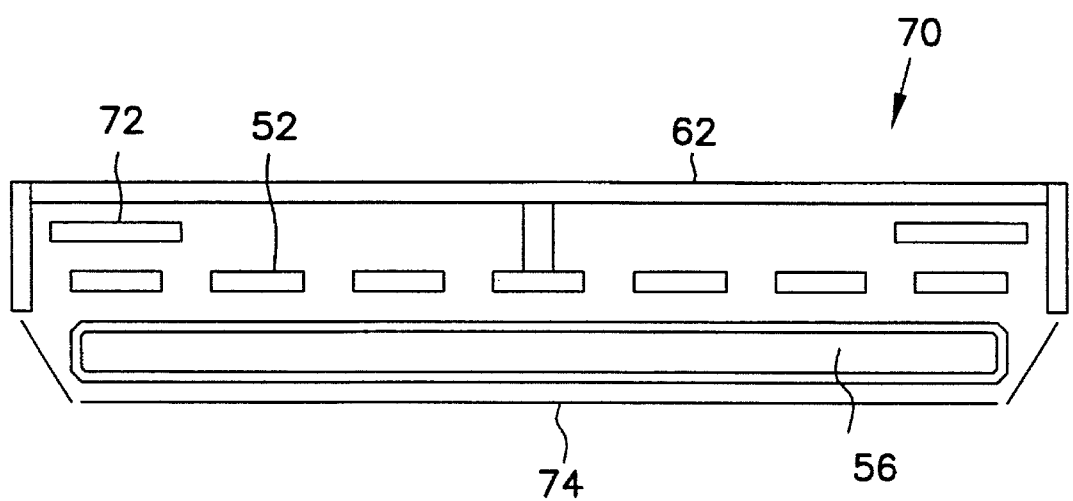
FIGS. 5a and 5b illustrate an electrodeless plasma lighting device with integral tuning capacitor.

One such embodiment of an integrated capacitor is shown generally as lighting device 70 in FIG. 5a. In FIG. 5a, annular disk capacitor plate 72 is placed between EMI shield 62 and inductive coupling structure 52. Capacitance between EMI shield 62 and plate 72 becomes load capacitor 26 of FIG. 1b. Capacitance between plate 72 and inductive coupling structure 52 becomes tuning capacitor 28 of FIG. 1b.

FIG. 5a also illustrates that additional EMI shielding may be obtained by having a ground potential wire mesh 74 encasing gas envelope 58 at all locations where inductive fields are not being coupled to the gas. This mesh could also act as a support and a means for keeping envelope 58 situated properly with regards to the inductive coupling structure 52. As noted above, a Faraday shield (not shown) could be inserted between coupling structure 52 and planar disk 56 to reduce capacitive coupling between structure 52 and the plasma.

It should be understood that the materials for making plasma generators 10 and 30 and lighting devices 50 and 70 are not critical. Dielectric medium 34 and envelope 58 may be made of many different grades of glass, fused silica, or other dielectrics. The fluorescent/phosphorescent material used to convert the UV light to broadband visible light could be many different combinations of materials suitable for such conversion. These materials are known to one skilled in the art and will not be discussed any further. Likewise, housing 31, capacitors 26 and 28, Faraday shields 42 and 54, wire mesh 74, planar spiral coil 32 and inductive coupling structure 52 may be formed from any highly conductive material, but copper and aluminum would be the most common materials for these components.

The size and shape of spiral coil 32 and inductive coupling structure 52 should be such that a strong enough electric field is generated in the gas envelope to sustain plasma. This will in general require several turns of a spiral coil but, conceivably, one turn is sufficient as long as its diameter is sufficiently large. (This statement is made based on the fact that the larger coils contribute more to the electric fields than do the smaller coils. Therefore, in a four turn, circular, uniformly spaced coil, the inner two turns could be removed with little change to the electric field profile in the gas.) Also, the shape of the spiral is not too critical; elliptical, square/rectangular and even triangular coils will work. It should be recognized that although the shape of the coil can vary, the shape of the electrical fields in general will remain similar.

Coil diameters used are typically on the order of 20 cm but can vary from this figure depending on the conditions of the gas and the coil configuration. In one embodiment, inductive coupling structure 52 of lighting devices 50 and 70 is formed from a spiral coil approximately 15 cm in diameter. It is important to note that a coil, or any other inductive coupling structure, may deviate somewhat from true planarity without adversely affecting its ability to generate a plasma.

Figure 5B:
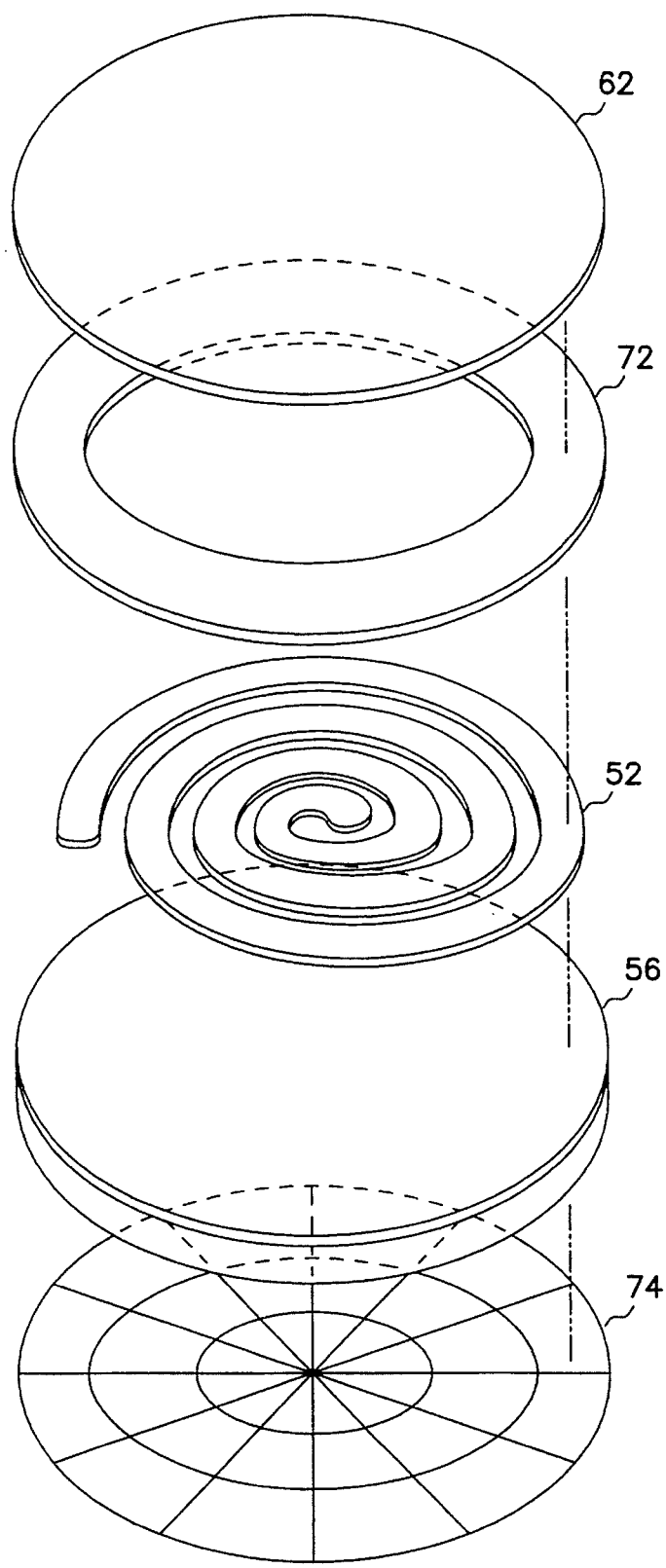

The coupling region will typically match the shape (and planarity) of inductive coupling structure 52. Other dimensions, such as the lower wall of the envelope are less critical. The height of the envelope will be such as accommodate the generation of plasma in the envelope, this requiring usually 1–3 cm of space between top and bottom walls of envelope 58. Heights greater than this are acceptable. An exploded view of parts of lighting device 70 is illustrated generally in FIG. 5b.

Since lighting devices 50 and 70 are essentially one-sided, planar lighting devices, the light emitted by the plasma that is in the direction of coupling structure 52 is normally lost. To reduce this loss, wall 34 of envelope 58 should be transparent, and coupling structure 52, Faraday shield 54 and other components should be polished so as to be reflective. The light emitted in the direction of coupling structure 52 will therefore be reflected back into the plasma region. In such an embodiment, coupling structure 52 and its related components also act as a reflecting yoke for the device.

Figure 6:
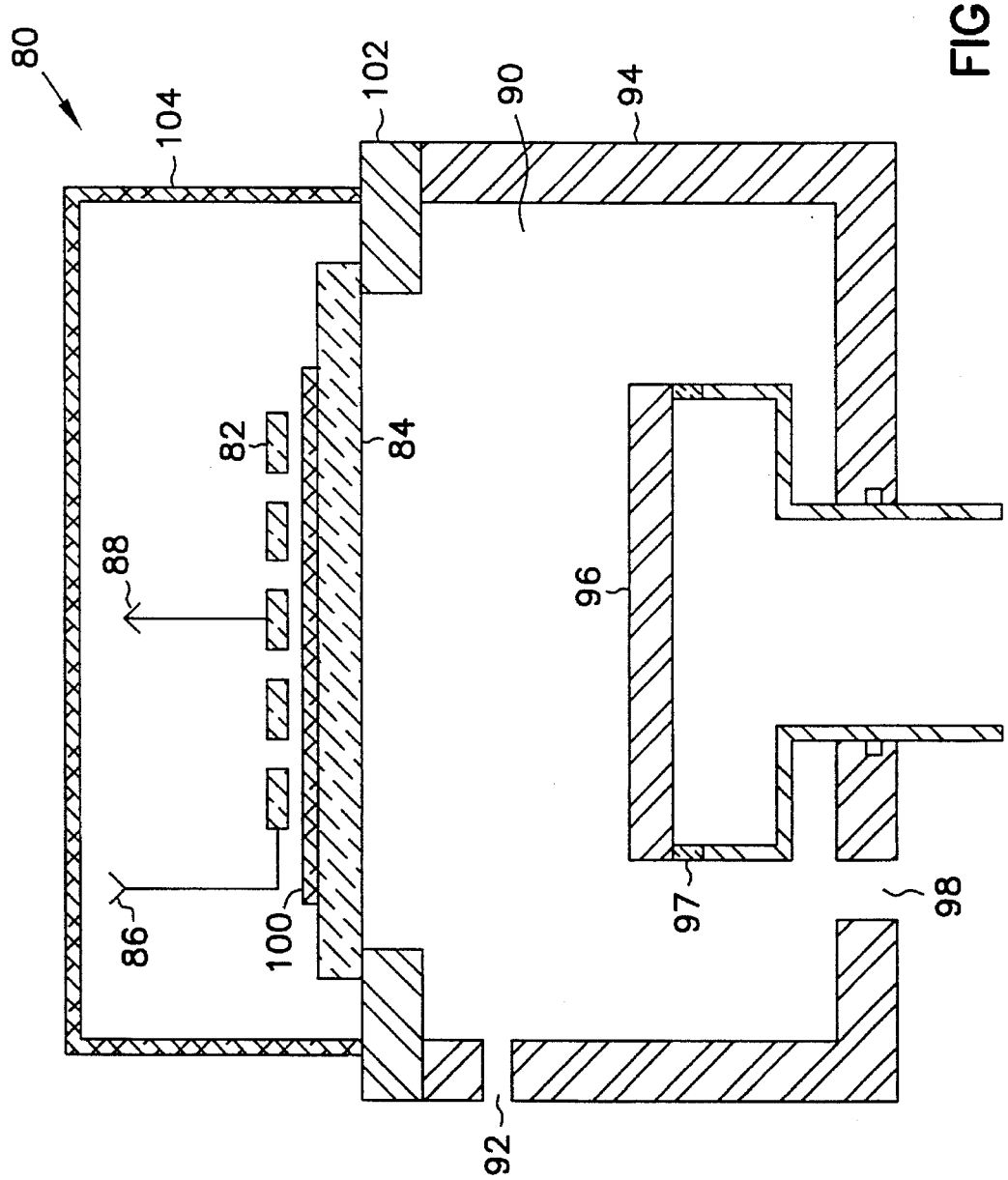
FIG. 6 is a cut away view of an inductively coupled plasma generator for use in plasma processing.

Plasma generator 40 of FIG. 3 can also be used advantageously in a plasma processing chamber 80 such as that shown generally in FIG. 6. Processing chamber 80 includes an inductive coupling structure 82 coupled through a dielectric medium 84 to a gas. An RF supply (not shown) connected to coil input 86 and coil output 88 supplies the current needed to induce a plasma within internal chamber 90. In operation, processing gas is injected into chamber 80 through a processing gas inlet 92 formed in chamber enclosure 94. The gas is ionized and used to process an item (such as a semiconductor wafer) placed on workpiece support 96. Workpiece support 96 is securely mounted to but electrically isolated from enclosure 94. In the preferred embodiment, the electrical isolation is achieved by placing dielectric inserts 97 between support 96 and chamber enclosure 94. A vacuum pump (not shown) then evacuates chamber 90 through vacuum pump exhaust port 98.

In the embodiment shown in FIG. 6, dielectric medium 84 rests on top of chamber lid 102 and is held to lid 102 by the vacuum within internal chamber 90. In addition, a Faraday shield 100 located between coupling structure 82 and dielectric medium 84 further reduces capacitive coupling between coupling structure 82 and the plasma. An EMI shield 104 encloses coupling structure 82. In one embodiment, impedance matching circuitry (formed, for instance, from annular disk capacitor plate 72 of FIGS. 5*a* and *b*) is placed within the region formed by shield 104 and coupling structure 82.

To this point, inductive coupling structures 52 and 82 have been described in terms of a planar coil such as spiral coil 32 of FIGS. 2 and 3. In other embodiments of devices 30, 40, 50, 70 and 80, however, the inductive element can be formed by placing a number of conductors in parallel. In such embodiments, parallel conductors disposed next to an essentially planar dielectric region couple to a gas through the dielectric region. There are several advantages of this design over the spiral design described above. These will be discussed below.

Figure 20B:
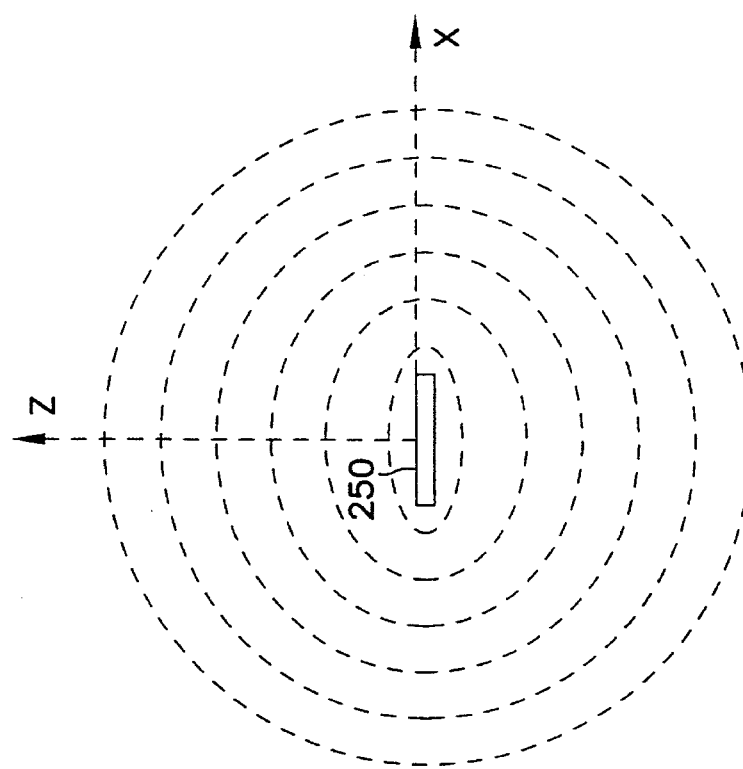
FIGS. 20a and 20b illustrate two views of the electric field generated by applying an oscillating current to an arbitrary width conductor.
Figure 20A:
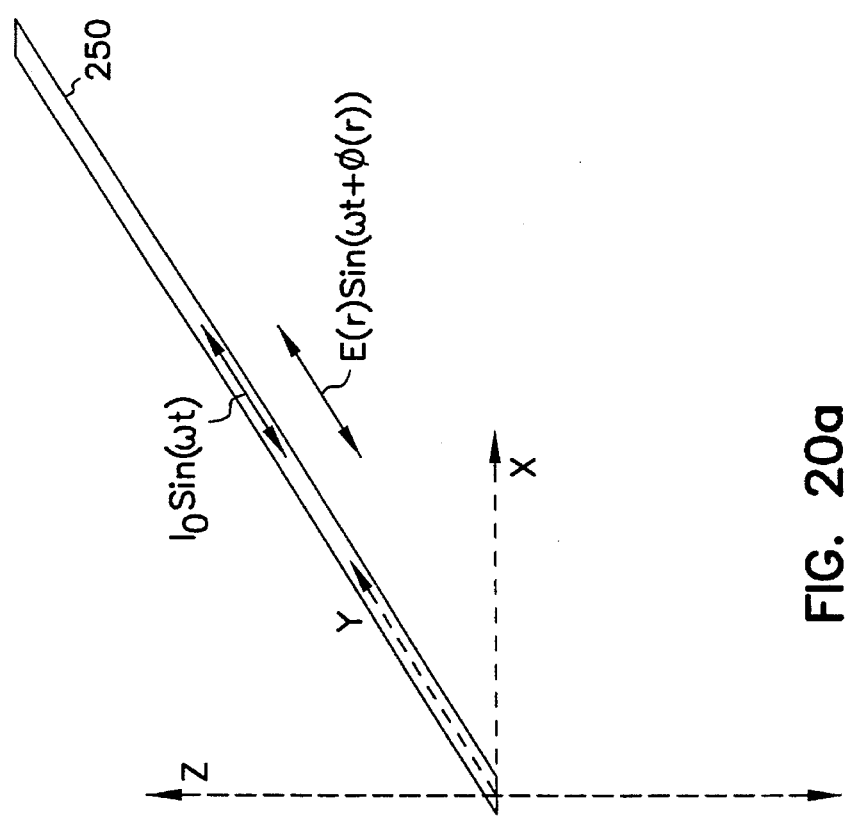

Prior inductively coupled sources have relied on the magnetic field concept or transformer concept to try and generate the highest density plasma by using a strong magnetic field. Ogle describes making a uniform magnetic field which results in a uniform plasma. In contrast, a parallel conductor inductor design relies more on the concept of producing a uniform electric field within a gas so as to create a uniform planar plasma. The basic concept that is exploited here is that of a single long straight conductor of arbitrary width placed next to a dielectric region. If an oscillating current $I_o\sin(\omega t)$ is driven ion the conductor, an electric field is induced in the gas. That electric field lies in the same direction and oscillates with the same frequency as the current oscillation on the conductor (but not necessarily with the same phase). Such an electric field is illustrated generally in FIGS. 20*a* and 20*b*, which show iso and end views of a long conductor 250 having an oscillating current which produces an oscillating electric field in the free space around conductor 250. FIG. 20*b* illustrates the contours of electric field strength associated with oscillating current $I_o\sin(\omega t)$. As is illustrated in FIGS. 20*a* and 20*b*, the strength of the electric field $E(r)\sin(\omega t+\phi(r))$ generated by conductor 250 will peak under the center of the conductor as we look down its length. This simple configuration can be used to make an inductive plasma.

Such a plasma would, however, vary with the intensity of the induced electric field. The density of the plasma produced by conductor 250 would most likely be highest near the strongest electric field (i.e. under the center of conductor 250) and the electron temperature would be highest in this region as well. To minimize such variation, the present invention relies on the principle of superposition to group the single conductors described above so as to form a broad area uniform plasma for processing or lighting uniformly. Since a single conductor plasma source as just described will always be peaked in the center, additional conductors are added and spaced to achieve a substantially uniform induced electric field over a large region.

Figure 21:
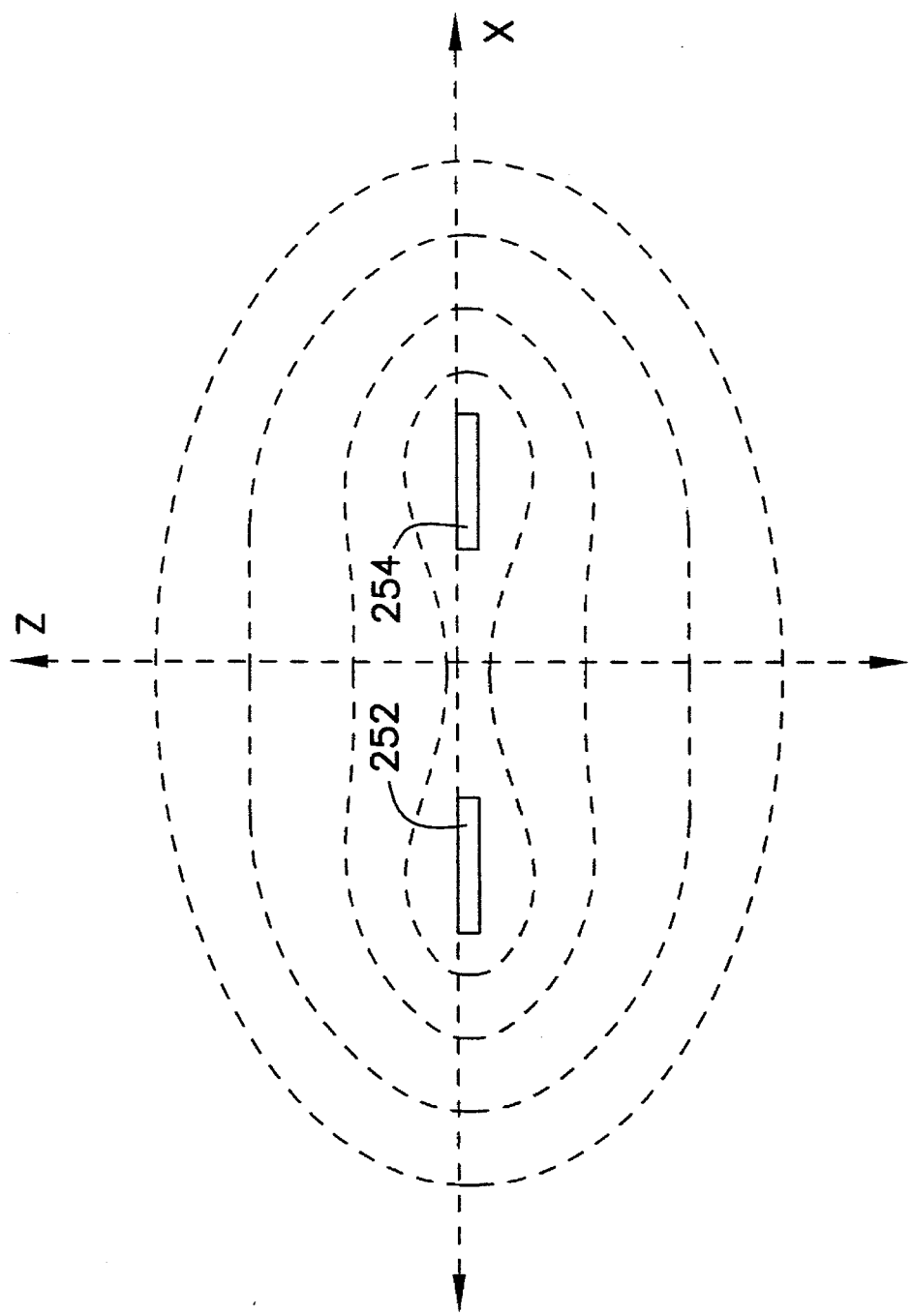
FIG. 21 illustrates an electric field generated by two arbitrary width conductors placed next to each other in a coupling plane.

Contributions from the conductors in the coupling plane will add if the currents on them are in phase. The effect of adding the electric fields generated by two substantially parallel conductors 252 and 254 (shown orthogonal to the page) is illustrated generally in FIG. 21 for the situation where substantially equal in-phase currents are present on conductors 252 and 254 (conductors 252 and 254 are shown coming out from the page (in the y direction)). This result is in contrast to the spiral designs of Ogle above in which currents flowing in opposite directions on opposite sides of the coil produce a subtractive situation near the center of the spiral coil and a radially non-uniform field. This superposition technique, therefore, can be used to generate a very uniform, broad area, electric field in the gas, resulting in a much more uniform plasma than that achievable using a planar coil such as the planar spiral coil.

Figure 7:
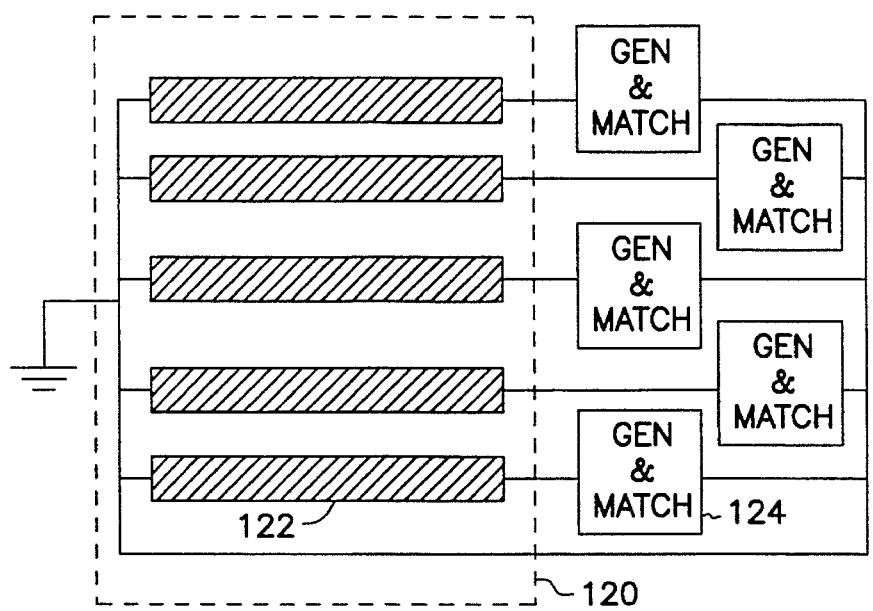
FIG. 7 is a top view of a parallel conductor inductive coupling structure having separate parallel conductors each driven by their own generator/tuning circuit.
Figure 8:
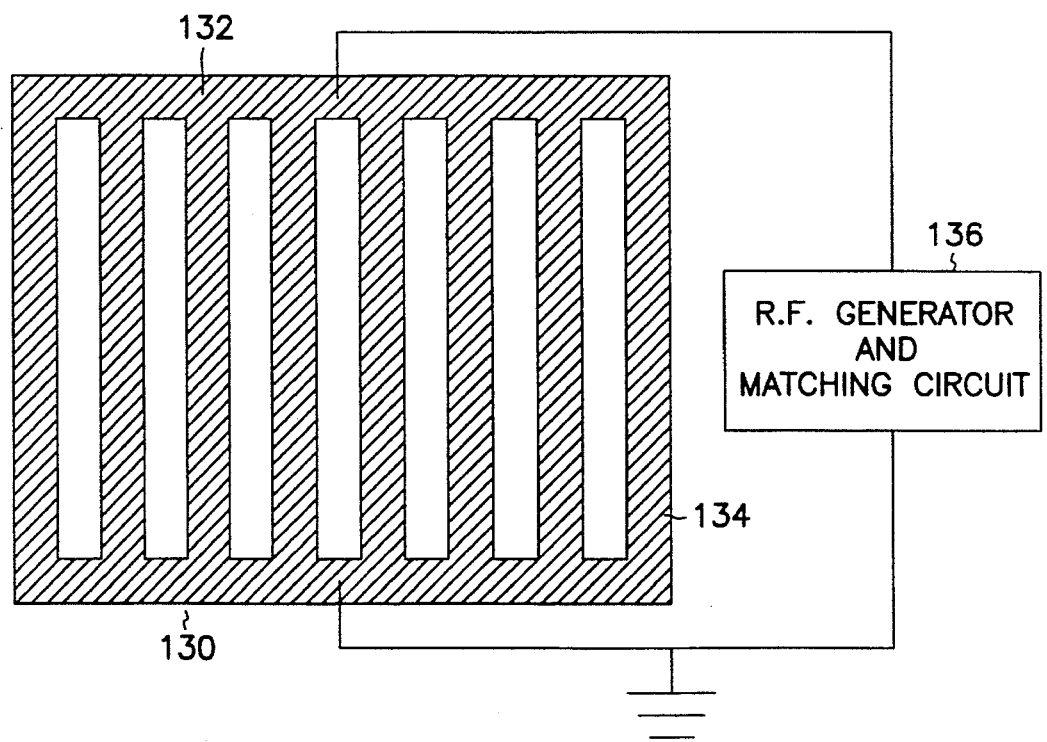
FIG. 8 is a top view of a parallel conductor inductive coupling structure formed from a single conductor having a number of separate parallel paths.
Figure 9A:
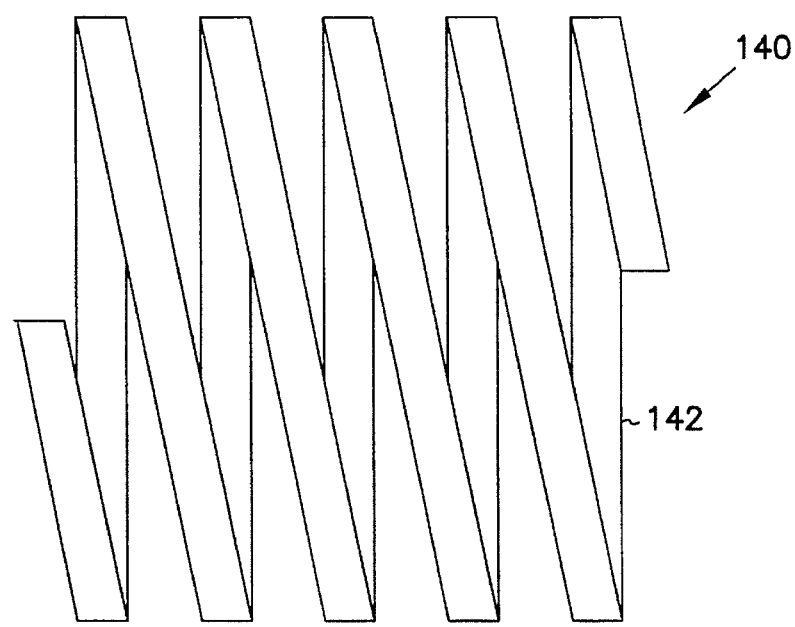
FIGS. 9a–9c are top, iso and side views respectively of a parallel conductor inductive coupling structure formed as a flattened helix.
Figure 9B:
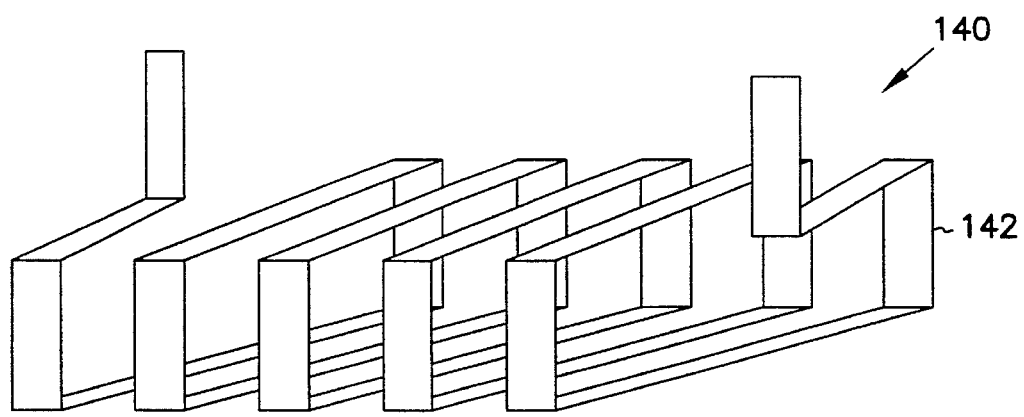
Figure 9C:
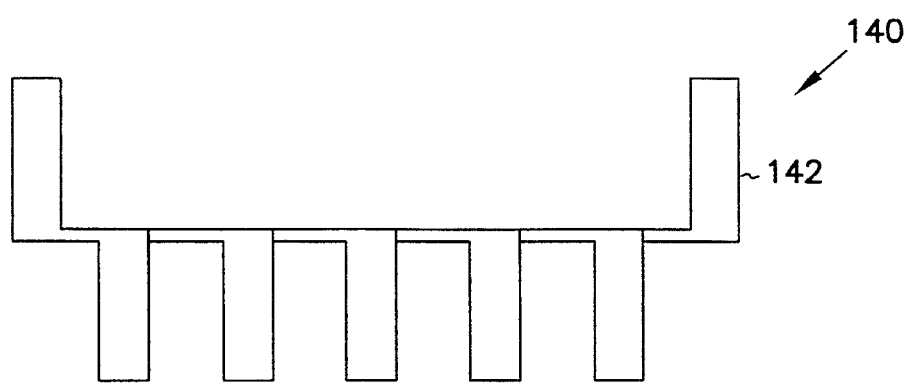
Figure 10A:
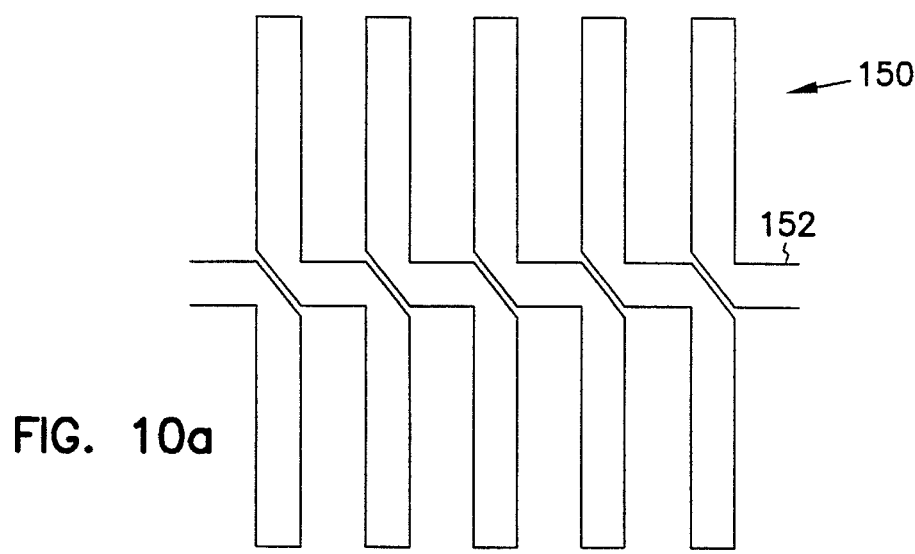
FIGS. 10a–10d are top, side, iso and end views respectively of a parallel conductor inductive coupling structure formed as a square coil flattened helix.
Figure 10B:
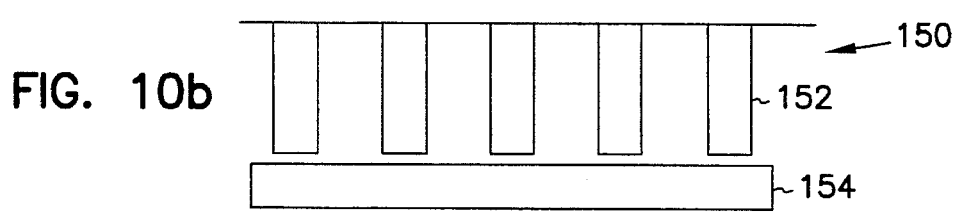
Figure 10C:
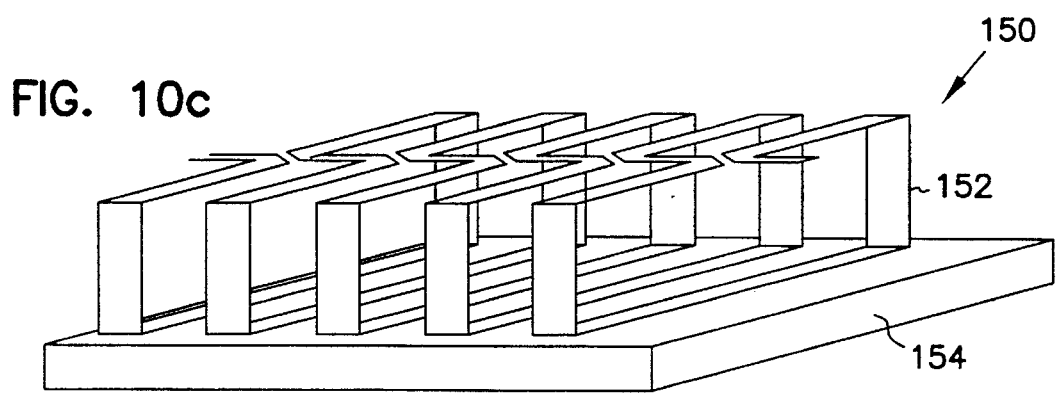
Figure 10D:
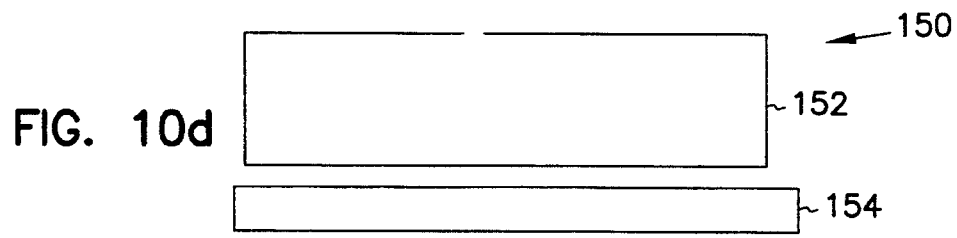

The parallel conductor coupling structure has two basic forms: 1) separate parallel conductors each driven by its own generator/tuning circuit; and 2) a single conductor such as a flattened helix or series of square coils driven by one generator/tuning circuit. A parallel conductor inductive coupling structure 120 implemented as separate parallel conductors 122 each driven by its own generator/tuning circuit 124 is shown generally in FIG. 7. A parallel conductor inductive coupling structure 130 implemented as a single conductor 132 having many parallel paths 134 and driven by one generator/tuning circuit 136 is shown generally in FIG. 8. Other embodiments of the single conductor parallel conductor coupling structure include the flattened helix of FIGS. 9*a–c* and the square coil flattened helix illustrated in FIGS. 10*a–d*. FIG. 9*a* is a top view of a flattened helix 140 formed as essentially parallel loops of a single conductor 142. FIGS. 9*b* and 9*c* are iso and side views, respectively, of the same helix 140. Similarly, FIG. 10*a* is a top view of a square coil flattened helix 150 formed from a single conductor 152. FIGS. 10*b–d* are side, iso and end views, respectively, of the same helix 150 adjacent a dielectric medium 154.

Figure 15:
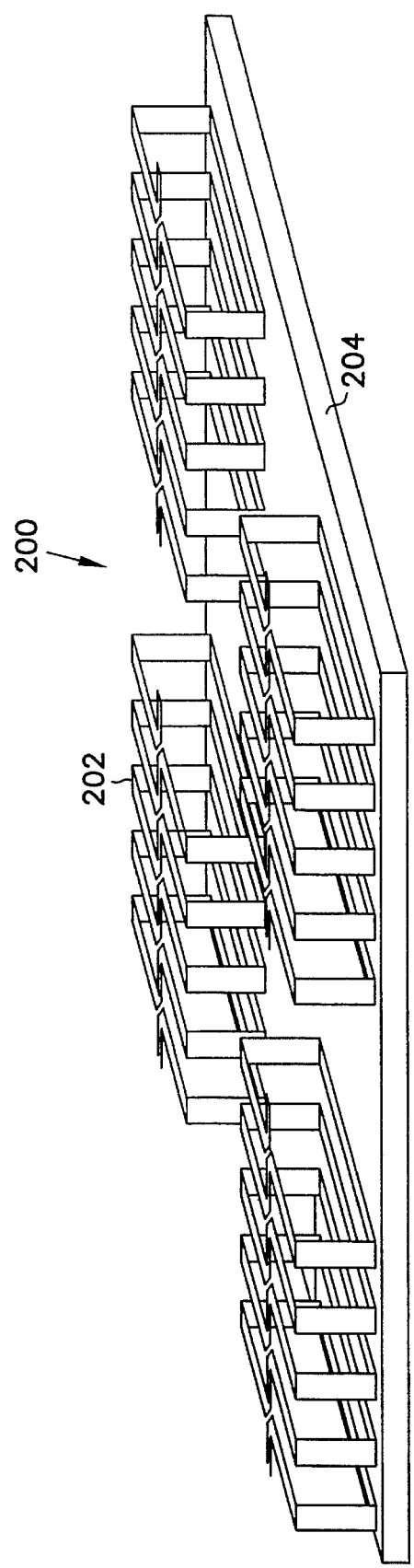
FIG. 15 is an iso view of an array of parallel conductor inductive coupling structures.
Figure 16:
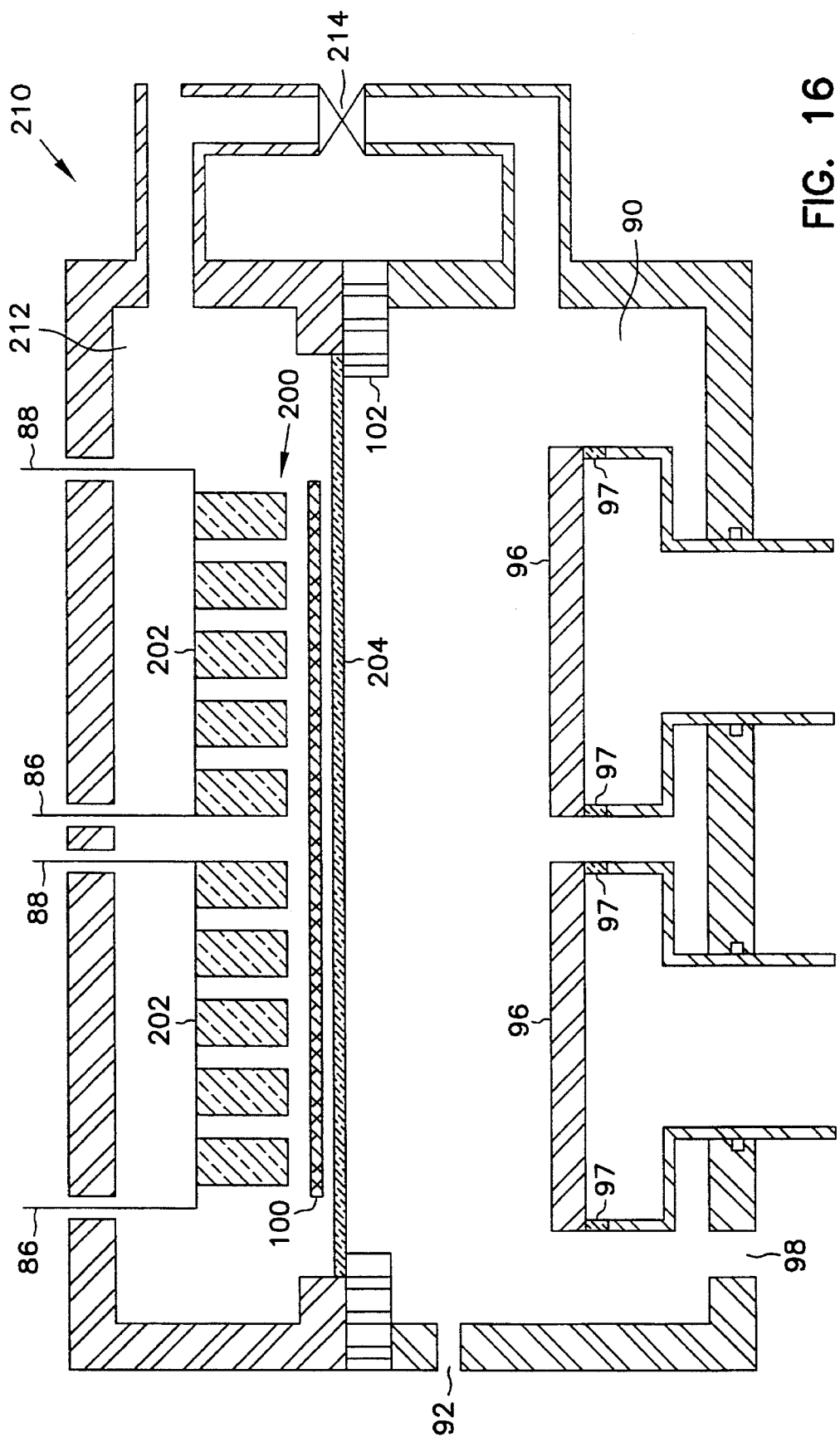

Coupling structures 120, 130, 140 and 150 provide uniform magnetic fields which can induce a broad area planar plasma. In addition, the shape of these coupling structures is such that two or more of any of the coupling structures can be placed next to each other as illustrated in FIG. 15 to generate larger area plasmas. This idea will be discussed in more detail below.

One advantage that parallel conductor inductive coupling structures have over the spiral coil described by Ogle is that since the contributions from each conductor add, less current on the conductors is required than in the spiral case and the coupling region can be smaller.

Figure 11B:
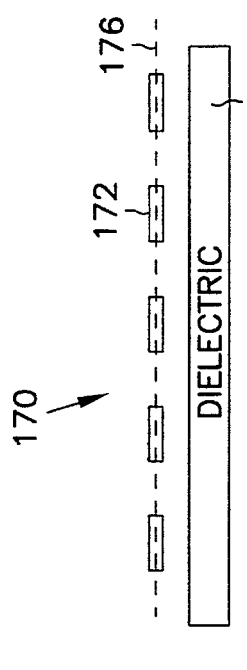
FIGS. 11a–11f are iso and side views of parallel conductor inductive coupling structures having different spacings between the conductors.
Figure 11D:
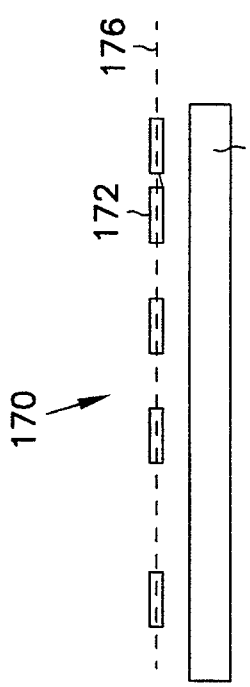
Figure 11F:
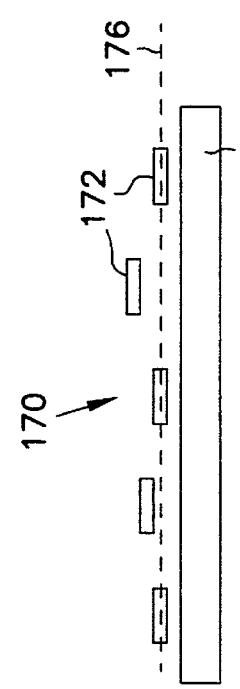
Figure 11A:
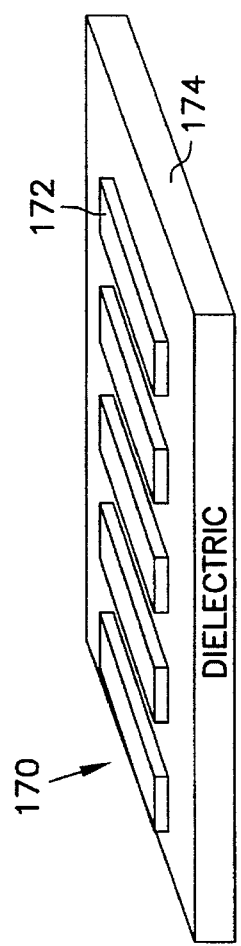
Figure 11C:
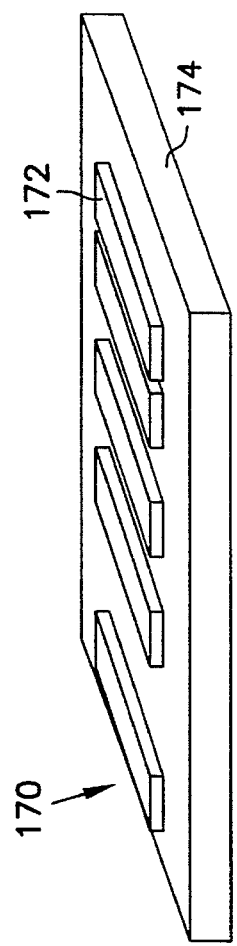
Figure 11E:
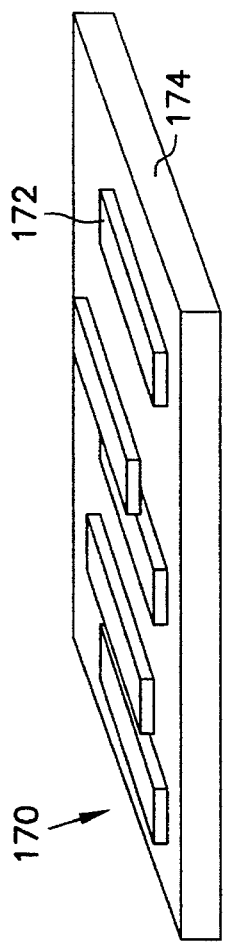

A further advantage of the parallel conductor method over the planar coil is that the field profile can be varied by moving the relative position of the conductors. The movement would conceivably be either away from the dielectric or in the plane so as to alter the planar spacing of the conductors. Both types of movement are illustrated in FIGS. 11*a–f*. FIGS. 11*a* and 11*b* illustrate iso and side views of uniform spacing of parallel conductors 172 within a coupling structure 170 placed adjacent a dielectric medium 174. FIGS. 11*c* and 11*d* illustrate iso and side views of a shift of one of the parallel conductors 170 within coupling plane 176. FIGS. 11*e* and 11*f* illustrate iso and side views of a shift of one of the parallel conductors 170 normal to coupling plane 176. The effect of such a shift is well understood to one skilled in the area of electrical fields and waves (the coupling strength of an individual conductor 170 to the plasma would be reduced by moving it in the direction away from the gas); any one or combination of several diagnostic tools could be used to determine how the conductors should be positioned to get the desired field and plasma profile. It should be apparent that the effect of varying the superposed magnetic field can be used advantageously to vary the cross-section of the broad area plasma generated.

In another embodiment, when separate generators 124 are used (as in coupling structure 120 of FIG. 7) the power/current and or phase of current on individual conductors 122 could be changed to modify the field profile in the plasma. It should be apparent that these ideas could be extended to the spiral design as well, but such an approach in a spiral coil design only accommodates changing the current or moving a particular coil in a direction normal to the planar surface.

Figure 12A:
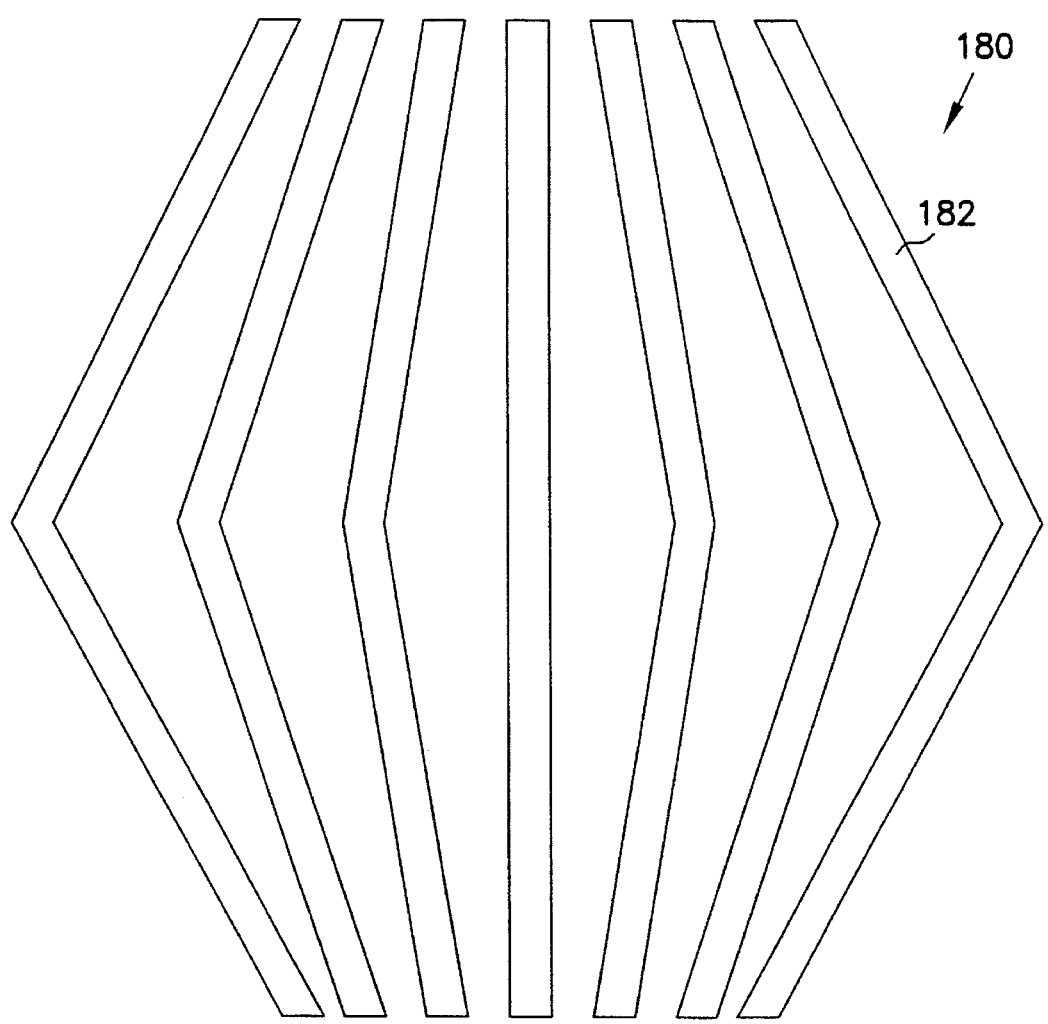
FIGS. 12a and 12b are top and side views respectively of another embodiment of a parallel conductor inductive coupling structure.
Figure 12B:
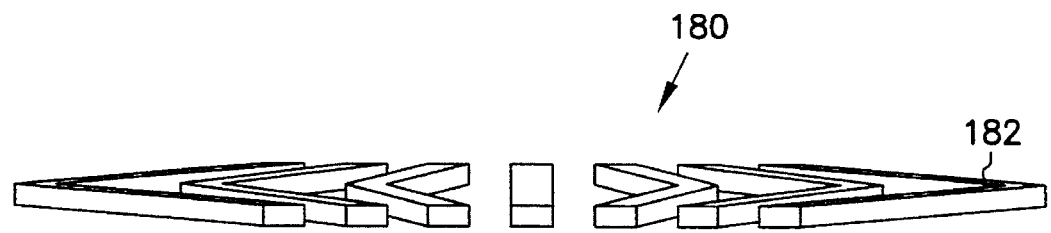

The conductors of structures 120, 130, 140, 150 and 170 are described as being "essentially" parallel in nature. It is intended that some deviation from planarity with bends and curves are still within the spirit of this invention. For instance, top and side views, respectively, of a coupling structure 180 having essentially parallel conductors 182 is shown generally in FIGS. 12*a* and 12*b*. A coupling structure such as that shown in FIGS. 12*a* and 12*b* still functions nearly identically to that of the more or less uniform parallel conductor sources mentioned thus far, but the shape of the coupling region and hence the plasma would be different. Also, some non-planarity in the direction normal to the coupling plane might also be used to alter the strength of the coupling along the length of a single conductor. Finally, it should be apparent that the length of the parallel conductors or paths which comprise the coupling structure need not be the same and that variations in length could be used to alter the shape of the coupling region and the plasma.

Figure 22A:
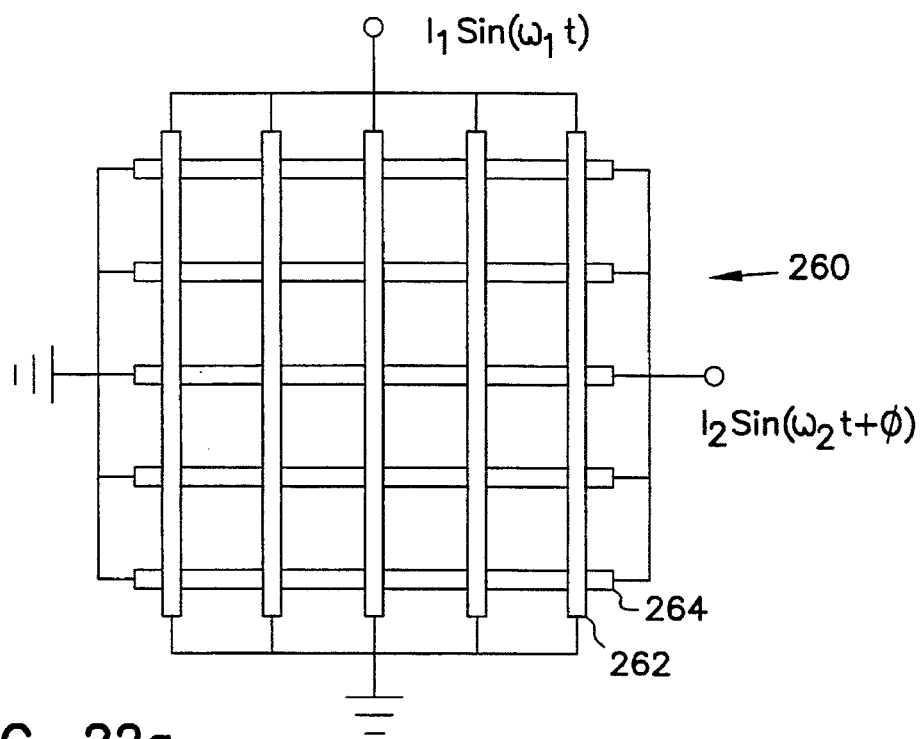
FIGS. 22a–22c illustrate top, side, and iso views, respectively, of an inductive coupling structure.
Figure 22B:
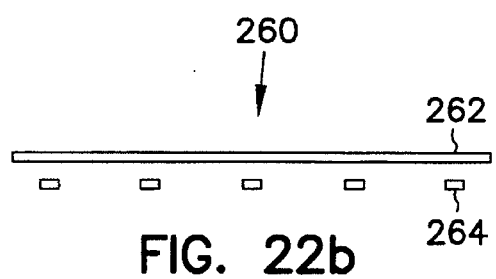
Figure 22C:
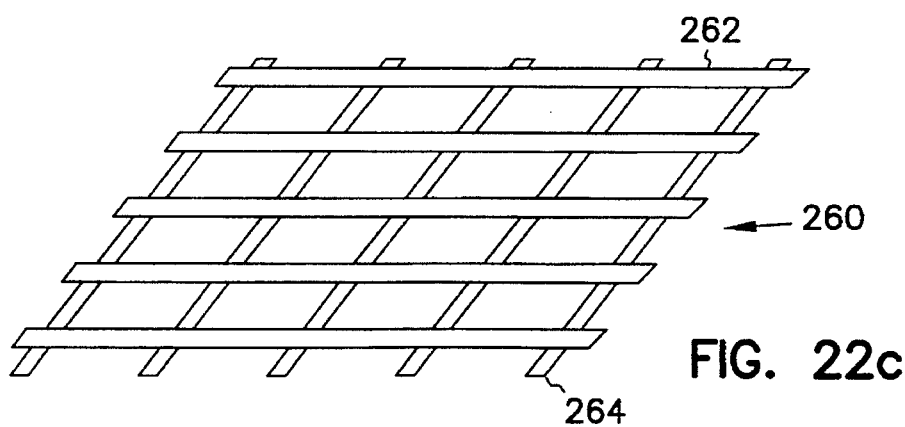

Another embodiment of a parallel conductor coupling structure is shown generally in FIGS. 22 and 23. FIGS. 22*a–c* illustrate top, side, and iso views, respectively, of an inductive coupling structure 260. Inductive coupling structure 260 includes a plurality of parallel conductors 262 placed adjacent to and in a direction orthogonal to the long conductors of a plurality of parallel conductors 264. Parallel conductors 262 and 264 would be placed very close to one another, i.e. almost in the same plane or, in one embodiment, in a woven design. The relative phase of the two conductors 262 and 264 can be controlled, but, in the preferred embodiment, the relative phase should be approximately 90°. This will create a circularly polarized electric field.

Inductive coupling structure 260 provides double the power input into a particular region of the plasma without raising the current/voltage on a single conductor. In addition, by placing the two sets of parallel conductors 262 and 264 essentially perpendicular to each other, the instantaneous power input is constrained to be approximately equal to the average power input. In other words, the power input should always be approximately the same. In addition, structure 260 serves to remove some (if not all) of the impact of asymmetry between the direction of the lengths of the parallel conductors 262 or 264 and the direction of their width. Finally, in one embodiment, parallel conductors 262 can be moved relative to parallel conductors 264 and normal to the coupling plane formed by inductive coupling structure 260. Such movement will tend to create an elliptically polarized electric field vector within the plasma. In another embodiment, it can be advantageous to move parallel conductors 262 relative to parallel conductors 264 and in a direction parallel to the coupling plane.

Figure 23A:
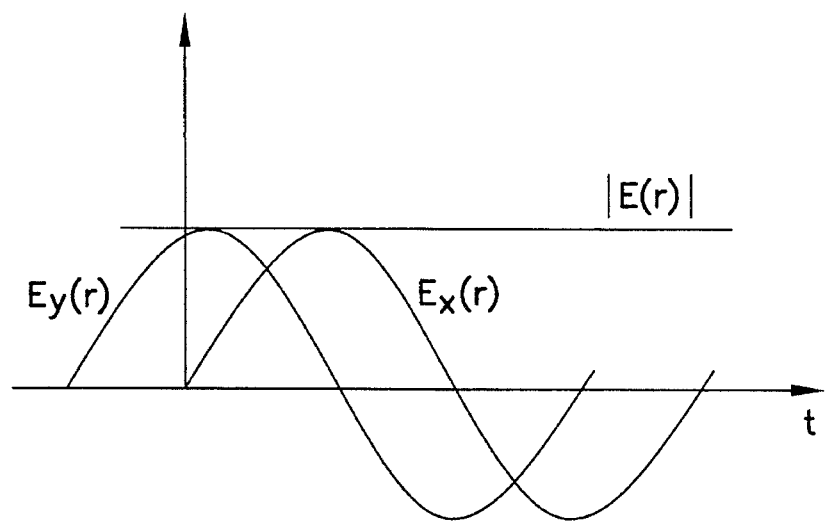
FIGS. 23a–23c illustrate the effect on an electric field at a point r when perpendicular conductors of the inductive coupling structure of FIGS. 22a–c are excited at the same frequency and magnitude of current but at a 90° phase shift between conductors.
Figure 23B:
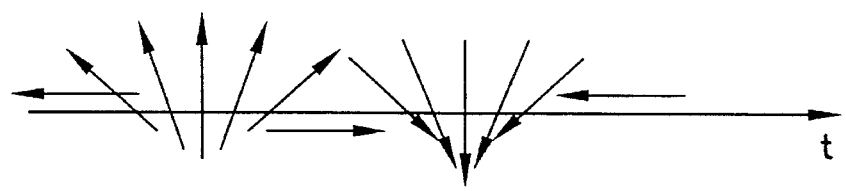
Figure 23C:
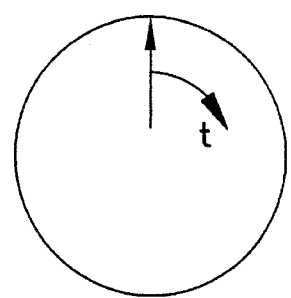

FIGS. 23*a–c* illustrate the effect on an electric field at a point r when parallel conductors 262 and 264 are excited at the same frequency and magnitude of current but at a 90° phase shift between conductors. This is a standard quadrature method for generating an elliptically or circularly polarized electric field.

It should be clear that coupling structure 260 could be extended to include all of the ideas of a single parallel conductor type source (e.g. flat helix geometries, movement in place and normal to the coupling plane, and an evacuated source) noted above.

Figure 16:
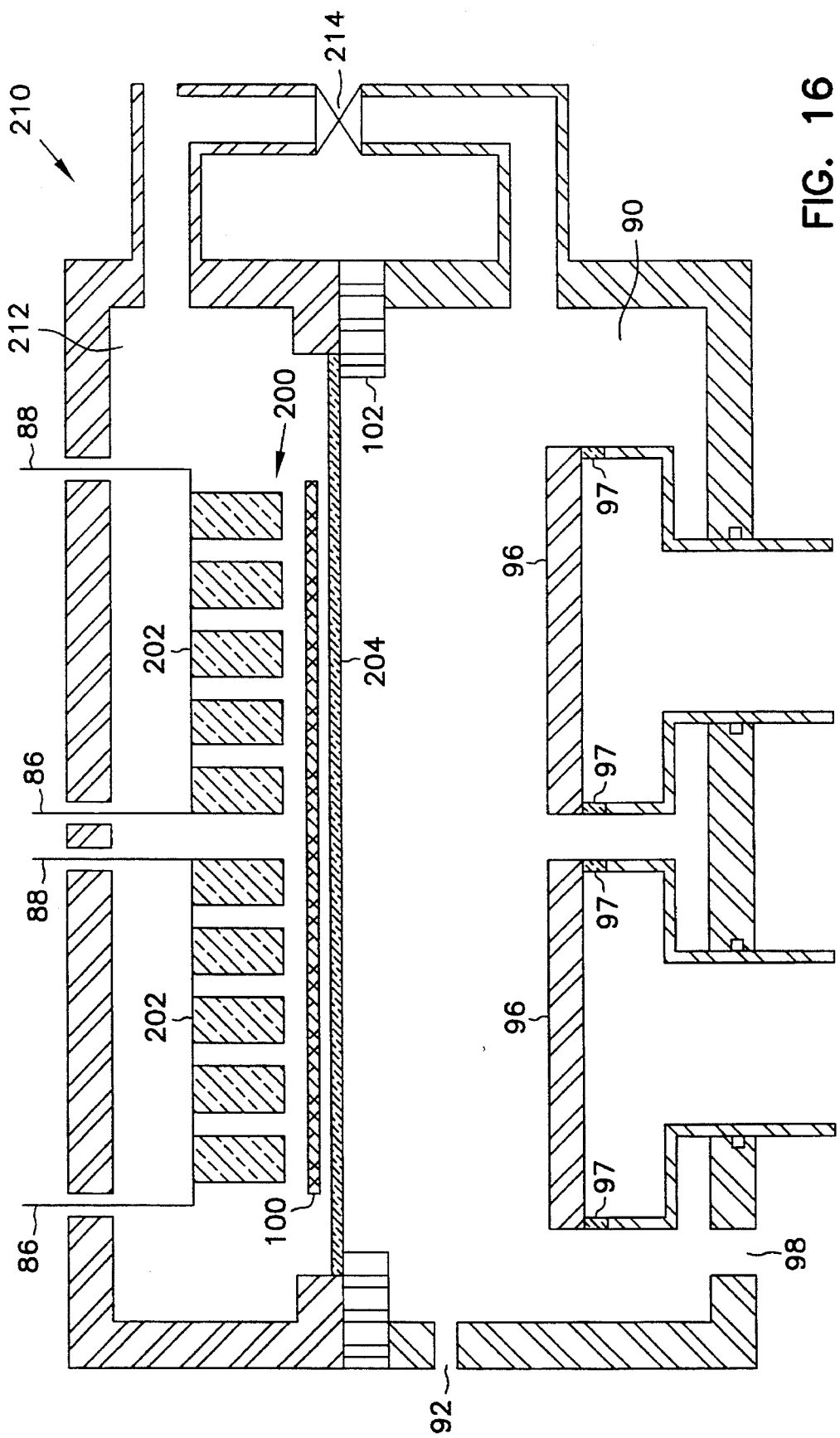
FIG. 16 is a cut away view of a inductively coupled plasma generator implemented with multiple parallel conductors.
Figure 13:
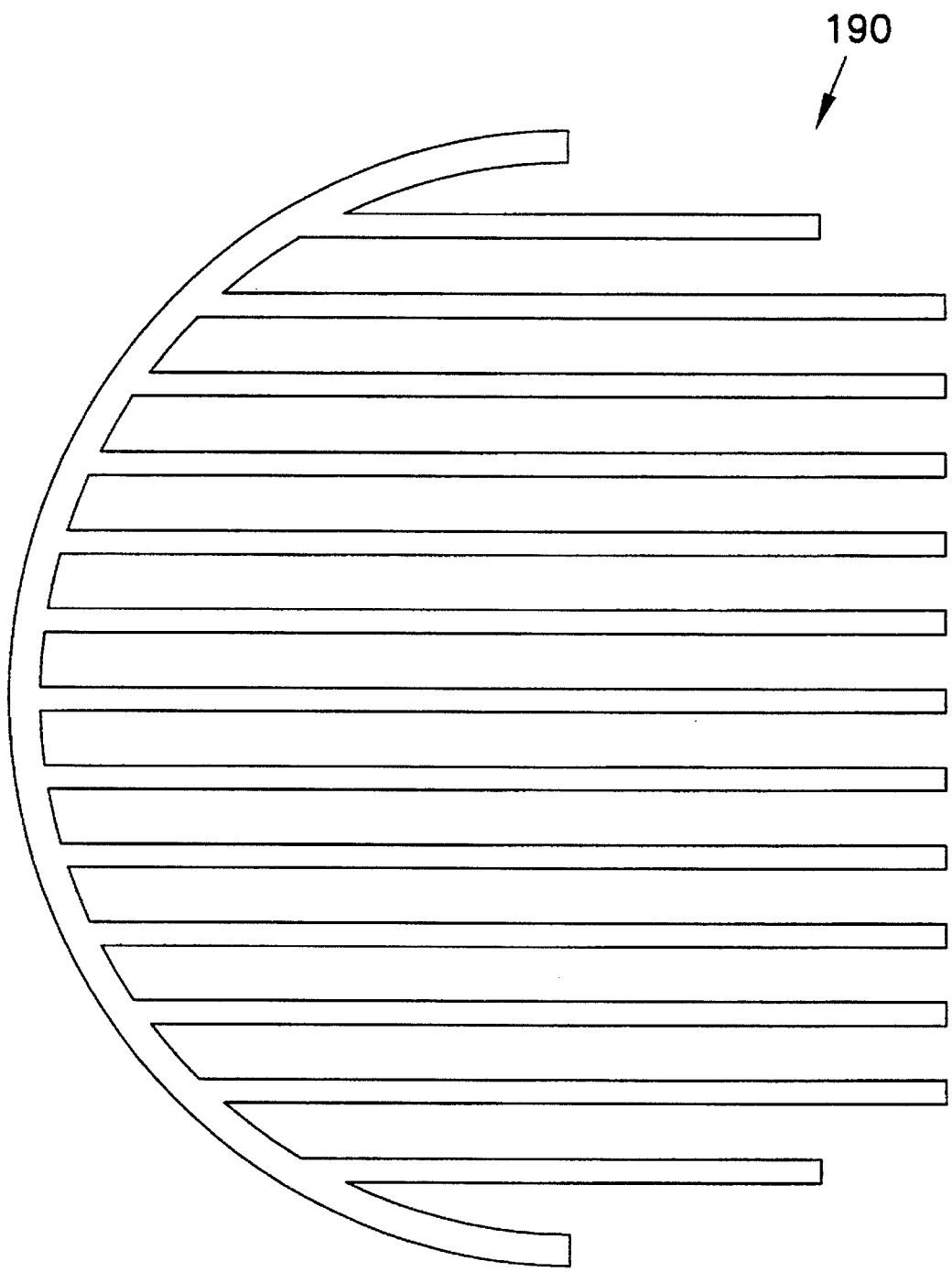
FIG. 13 is a top view of a Faraday shield which can be used with a parallel conductor inductive coupling structure.

Faraday shields can also be used for this device, but such a shield will be of a different style than those use with the spiral structures. An example of Faraday shield 190 for use with a parallel conductor inductive coupling structure is shown in FIG. 13. Also, magnetic confinement buckets can be used with parallel conductor designs as well as spiral designs. Finally, multiple coupling regions could be used. For instance, two separate coupling regions could be used to place a coating of a polymeric or other web on both sides of an item suspended in a chamber. In one embodiment, as is illustrated in FIG. 16, two opposed parallel conductor inductively coupled plasma generators are provided, one for each side of the material.

Next, specific applications using parallel conductor inductive coupling structures will be described, beginning with plasma processing. In parallel conductor inductive coupling plasma processing, as can be understood by viewing processing chamber 81 of FIG. 14, coupling structure 83 is a parallel conductor coupling structure such as flattened helix 140 in FIGS. 9*a–c* or helix 150 in FIGS. 10*a–d*. in such an embodiment, parallel conductor coupling structure 83 is placed near a dielectric region (dielectric medium 84) which forms one boundary of a vacuum-tight enclosure. The coupling plane of the parallel conductors is substantially parallel to the plane of the dielectric region. The vacuum tight enclosure includes means for evacuating the enclosure and means for injecting gas into the enclosure. Since even distribution of gas into the plasma region is desired, in one embodiment a "ring" delivery system (not shown in FIG. 14) is used. (In such an embodiment it can be advantageous to make the distance of the ring from the dielectric coupling region adjustable.) Since some processes require more than one process gas (e.g., the deposition of silicon dioxide from oxygen and silane), in an alternate embodiment a separate input region (not shown) is provided for each gas.

In one embodiment, workpiece support 96 supports silicon wafers or other planar workpieces. In such an embodiment, support 96 is placed to support the workpiece so that it is parallel to the plane of the dielectric and of the parallel conductors. In the preferred embodiment, the distance of support 96 from dielectric medium 84 is also adjustable. In one embodiment, means (not shown) are provided for coupling other electrical inputs to support 96 for the purpose of electrically biasing support 96 relative to the rest of the system. This may be done with a separate generator or by using the same generator used for driving flattened coil 83. In an embodiment having a separate generator, support 96 is either driven with an oscillating frequency signal, maintained at a set bias voltage, or a combination of both. If the frequency of the oscillation of the electric field on support 96 and coupling structure 83 are the same, it is often desirable to have control over the relative phase between the two. This can be done using any of the commonly available "common exciter" or phase delay techniques.

In one embodiment, support 96 contains means for temperature control. In another embodiment, electrical isolation of the workpiece is enhanced by electrostatically holding the wafer to support 96 and using gaseous backside cooling.

Figure 14:
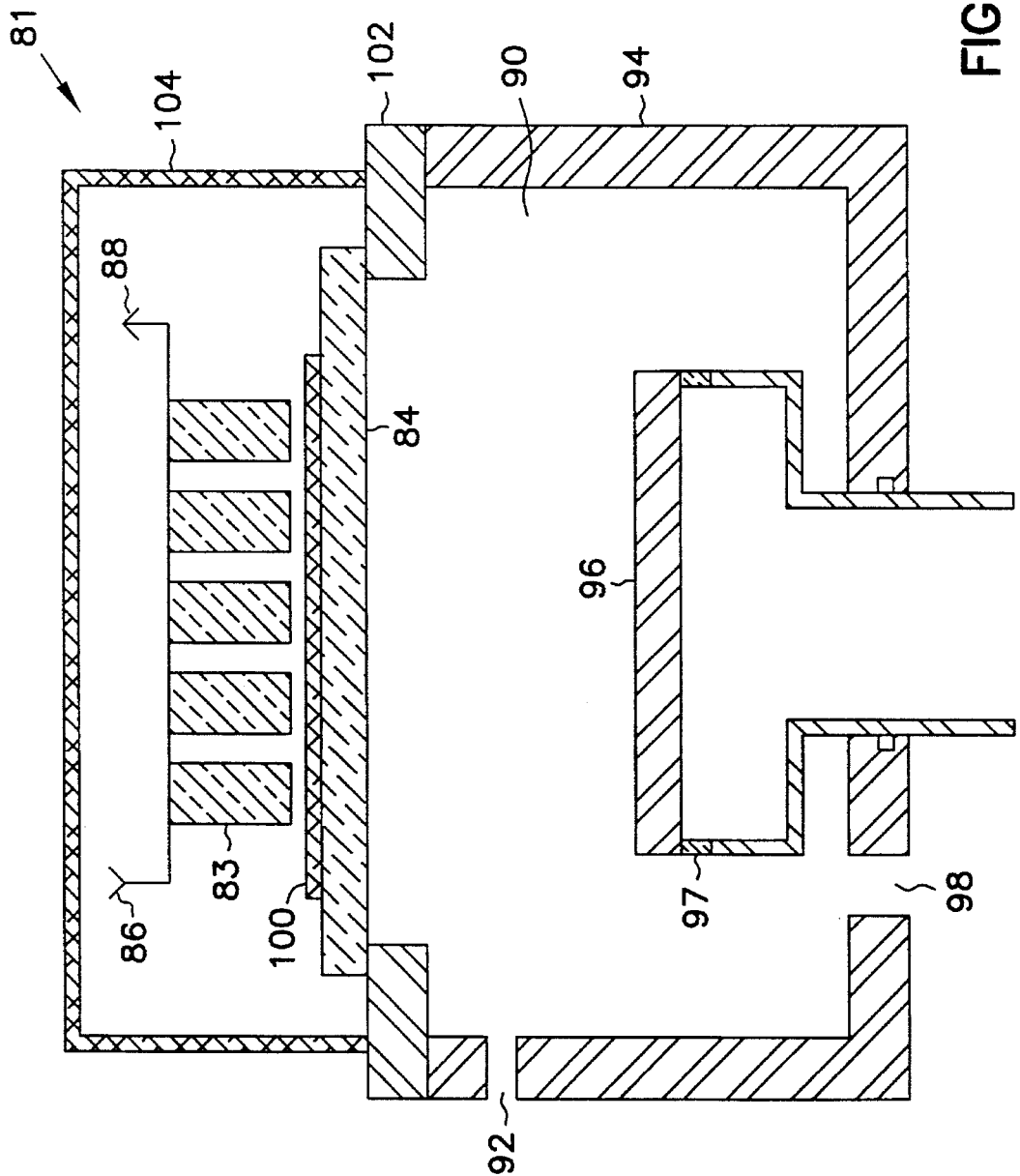
FIG. 14 is a cut away view of an inductively coupled plasma generator for use in plasma processing.

As described above, a plasma generator such as processing chamber 81 of FIG. 14 is driven by one or more generators connected to inductive coupling structure 83 through one or more impedance matching or tuning circuits. The matching circuits match the impedance of the generator (typically at 13.56 MHz and 50W) to coupling structure 83 and to the plasma (not shown). A typical L-type configuration has been shown as matching network 24 of FIG. 1*b*, but many other circuit configurations exist which would be adequate.

In processing chamber 81 of FIG. 14, Faraday shield 100 blocks some of the direct electric fields generated by coupling structure 83. These fields are present because, along with the high currents on the coil that are generated with the resonant circuit, high electric fields can also be present. If allowed to penetrate directly into the plasma, these fields will create capacitive coupling effects in the gas. As stated previously, Faraday shield 100 blocks most of these fields, thereby reducing the capacitive effects.

In the case of parallel conductor inductive coupling structures, use of a Faraday shield 100 can be a source of some problems. For instance, in the case of square coil flattened helix 150 of FIGS. 10-d, electrical arcs may occur between the high voltage end of the coupling structure and the Faraday shield. This problem can be reduced by rounding the corners of the square coil loops to reduce high fields at the corners. An alternate solution is to increase the spacing between coupling structure 83 and Faraday shield 100. This approach is, however, less desirable because the fields generated in the plasma are also then reduced. In one embodiment, a dielectric of high breakdown strength is placed between coupling structure 83 and Faraday shield 100. This could, for example, be the same dielectric material that is used for dielectric medium 84. Yet another solution is to evacuate the region between coupling structure 83 and Faraday shield 86. This solution has other advantages which will be discussed below.

As an added benefit, parallel conductor coupling structures can De paralleled to increase (or scale-up) the cross-sectional area of the plasma generating device. This becomes important when one wants to process more than one silicon wafer at a time or to coat large polymer or paper webs. The reason for using a multiple generator/coupling structure configuration follows from the discussion in the preceding paragraph. If one large coupling structure was to be used, the voltage at the "hot" end of the coil would become quite large. This would place stricter requirements on the configuration of the coupling conductors, the spacing between the conductors and the Faraday shield and the power and voltage handling capabilities of the tuning circuit.

In addition, the turn-on power for a plasma is in general non-zero. For instance, an average size (20 cm) spiral coil may have a turn-on power requirement of several hundred watts depending on the neutral pressure and the composition of the gas. To try and increase the size of a single coupling structure would mean driving a larger and larger area, which again means that power would increase just to turn the device on. Furthermore, the voltages and currents of these devices are much higher before the device is turned on. This is because the "Q" of the unloaded circuit (i.e. with no plasma on) is much higher than that of the loaded (with plasma on) circuit. Simply put, this means that power is delivered to the components of the matching circuit and other stray coupled components before the plasma is on and mainly to the plasma after it is initiated. In the context of the present discussion, this effect can be seen to further aggravate the already undesirably high voltages that develop before the plasma is on by making the turn-on power even higher for larger devices.

Further, it should be apparent that the circular spiral coil (or even a square spiral coil) cannot be placed in a plural configuration that would result in a single large area virtual coupling structure. This is because the shapes of the field generated by the spiral coils would result in non-uniformities in the induced electric fields at the points where the induced electric fields from adjacent coils are strongly overlapping. In contrast, in parallel conductor coupling structures the field contributions of each of the conductors adds to the others, and the spacing and current can be varied on each one to maintain uniform fields. In situations where the actual length of the parallel conductor becomes too great, a coupling array 200 of individual coupling structures 202 placed next to a common dielectric region 204 could be formed as is illustrated generally in FIG. 15.

In coupling array 200 of FIG. 15, the field contributions of each of the planar coupling regions add in a more uniform manner than would those of spiral coils to produce a large uniform electric field in the plasma region. It has been found to be advantageous to have phase control over the generators driving each coupling structure 202 so that the devices are in phase and the fields produced by each structure 202 add.

The problems with scale-up can best be understood in the context of the multiple coupling structure/multiple workpiece processing chamber 210 illustrated in FIG. 16. One problem encountered with scale-up is that the thickness of dielectric 204 must increase as its area increases in order to withstand the forces from the vacuum in internal chamber 90. As the dielectric thickness increases either the spacing between coupling array 200 and the gas has to be increased to prevent arcing between the inductive coupling structure 200 and Faraday shield 100 (requiring that even higher fields be maintained on coupling structure) or a better dielectric must be introduced between coupling array 200 and shield 100. One such better dielectric is a vacuum. Therefore, in the embodiment illustrated in FIG. 16, coupling structure region 212 is evacuated to a pressure lower than that suitable for starting an inductive plasma in the coupling structure region 212. This is typically less than $10^{-5}$ Torr. Suitable pressures for operating the region 212 above the pressure of chamber 90 could also be found, but the risk of electrical arcs would be higher.

This approach relaxes the requirements on dielectric region 204, while maintaining better coupling between coupling array 200 and the gas. Several variants of this idea could be employed. The first would be to have only coupling array 200 (no matching circuit) within evacuated region 212. In such an embodiment, vacuum feedthroughs would introduce the driving power to the parallel conductors and the matching network(s) would reside outside evacuated region 212. A second technique would be to place the matching circuitry inside region 212. This second approach is better. For instance, arcing is usually associated with the tuning capacitors (in fact they are usually high voltage vacuum capacitors) due to the high voltage residing on them. Placing these capacitors in an evacuated chamber allows the use of much less expensive capacitors as well as eliminates arcing between the capacitors and other parts of the circuit. The requirements on the electrical feedthrough used in this case would also be less severe than with an exterior matching circuit. The major drawback of this approach is that the tuning of the capacitors has to be done via coupling mechanisms that feed through the chamber wall to the matching network components as well. This adds complication to the device, but is still easily achieved. Also, safeguards must be in place so that the pressure differential between the processing chamber and the coil chamber remains low. In FIG. 16, safety valve 214 ensures that the pressure differential between internal chamber 90 and region 212 does not become excessive. Again, these additional safety features add complexity but are not difficult. One alternate approach that would make maintaining two approximately equal pressure chambers less of a problem is addition of a load lock chamber. This is a separate chamber where materials to be processed are introduced and then the chamber is evacuated to the low processing pressure. A valve is then opened and the materials are introduced into the processing region.

Figure 17:
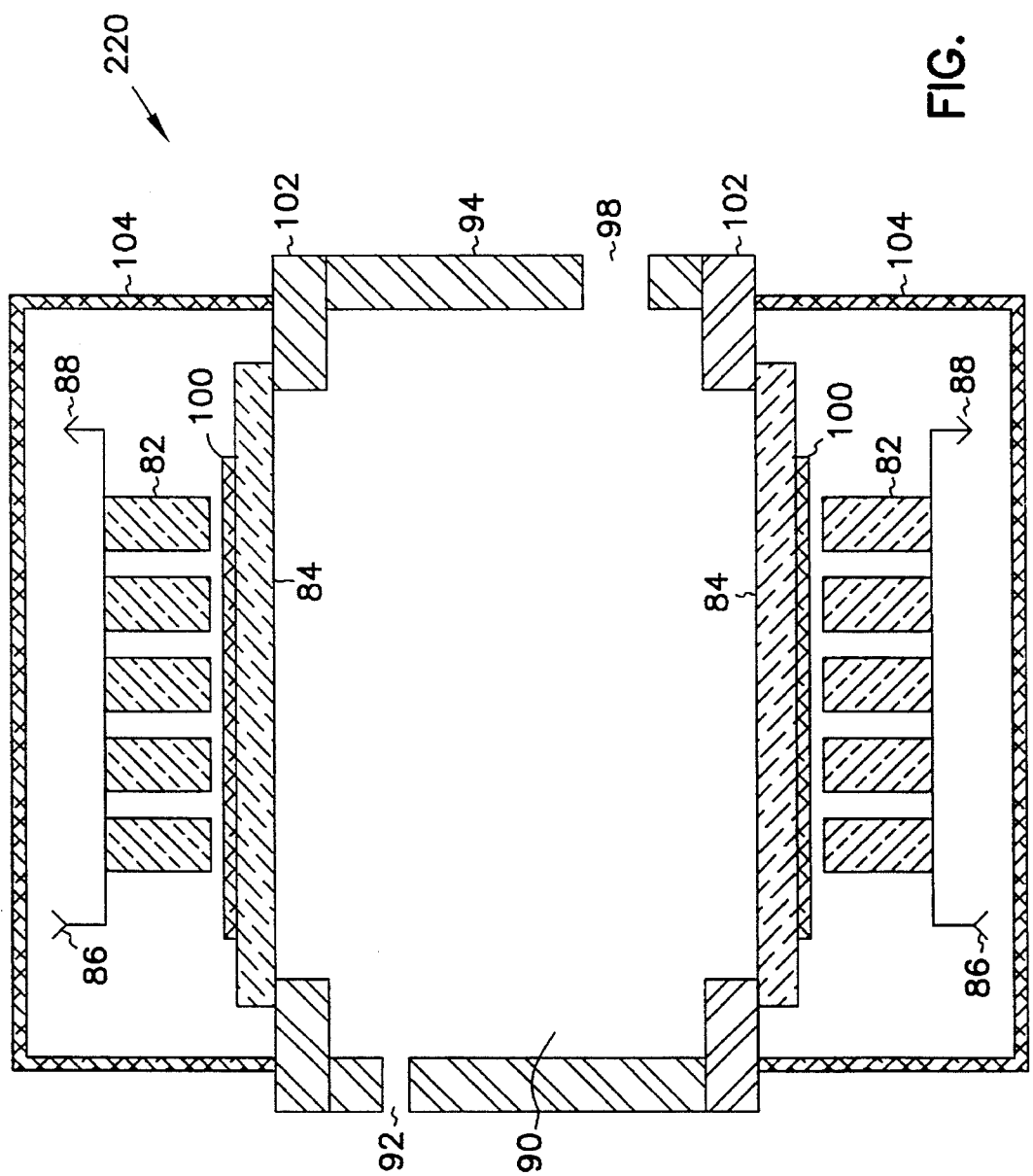
FIG. 17 is a cut away view of a inductively coupled plasma generator having facing parallel conductor inductive coupling structures.

As was mentioned above, it is sometimes desirable to process both sides of a material at once. Polymer or paper webs were mentioned above, and frequently require processing on both sides of the material. This could be accomplished more easily with two sources on opposite sides of the main chamber region of a plasma processing device 220 as shown in FIG. 17. Other configurations having multiple sources not lying in the same planar region are possible as well.

There also exists the possibility of using more than one dielectric to compose dielectric medium 84 or dielectric region 204. This configuration could be used with either the evacuated or normal source region. In one such embodiment, supports for the individual dielectric pieces are made of either metallic or ceramic cross beams; sealing is accomplished via o-rings between the beams and the dielectric pieces.

Figure 18A:
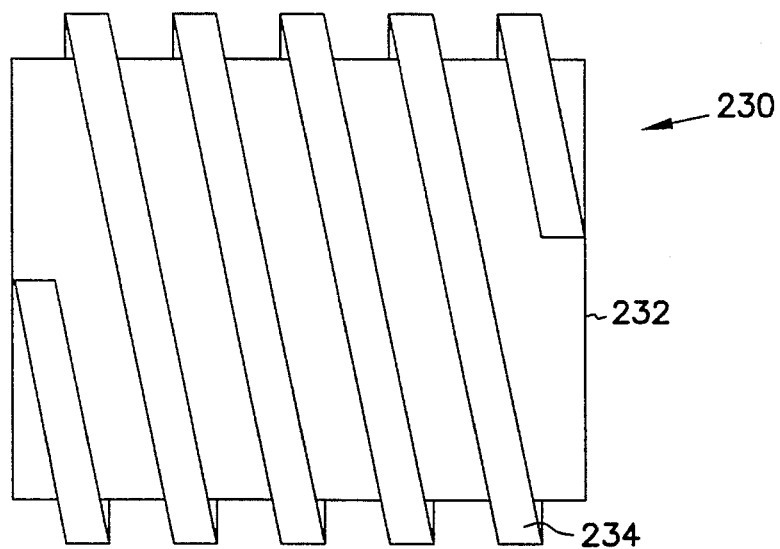
FIGS. 18a–18c are top, iso and side views respectively of a parallel conductor inductive coupling structure with magnetic core.
Figure 18B:
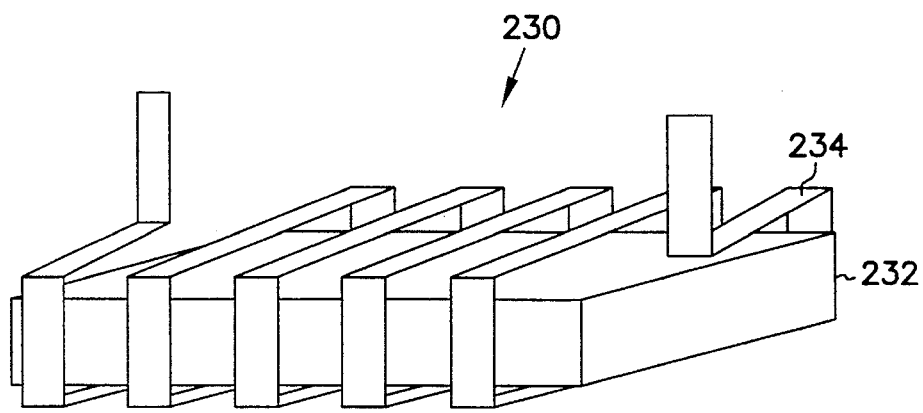
Figure 18C:
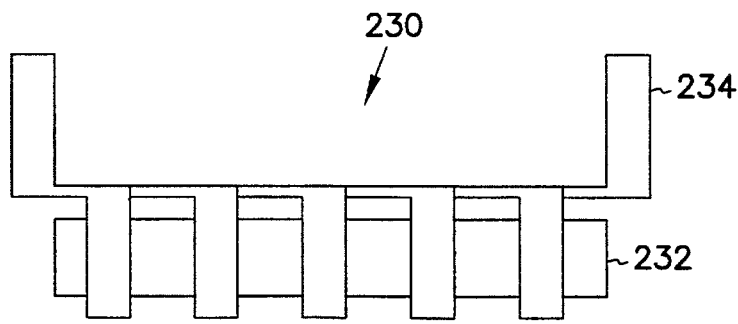

The above examples dealt with applications in the area of plasma processing. It should be apparent that the above ideas for parallel conductor plasma processing as well as those for planar spiral lighting devices (FIGS. 4 and 5) are applicable to parallel conductor inductive coupling lighting devices. One benefit of using parallel conductor inductive coupling structures in a plasma lighting device is that, for certain types of structure, transformer coupling between the structure and the plasma can be increased through the use of magnetic core material. For instance, as is illustrated in coupling structure 230 of FIGS. 18a–c, magnetic core material 232 could be inserted through a flat helix coil 234 to increase the transformer coupling of the magnetic fields to the gas. With or without magnetic core material 232, parallel conductor coupling structures can be used as the coupling structures of FIGS. 2, 3, 4a, 4b, 5a and 5b above.

In addition, there may be advantages to combining a spiral coil with a parallel conductor structure in a hybrid coupling structure A parallel conductor coupling structure 242, as shown in FIGS. 19a and 19b, could also be used to "fill-in" the middle of a large spiral coupling coil 244 to form hybrid inductive coupling structure 240. In the embodiment shown in FIGS. 19a and 19b, coupling structures 242 and 244 are driven in series by a single generator and matching circuit (not shown) through I/O leads 246 and 248. In another embodiment, two separate generators, each with associated matching circuit, are used. The two generator approach does offer an advantage when it comes to starting the plasma. The smaller inner parallel conductor coil (such as a flat helix type) could be used to start the plasma and make it easier for the larger turns of the spiral to generate additional plasma. The uniformity of this device would also be potentially increased because the electric field along the axis of the coil would not contain the node it does with standard spiral designs.

It is clear that the present invention operates to provide an apparatus and method for broad area plasma generation with applications in areas of plasma processing including semiconductor fabrication and inductive plasma lighting devices. This application is intended to cover any adaptations or variations of the present invention. Therefore, it is intended that this invention be limited only by the claims and the equivalents thereof.

What is claimed is:

1. An inductive coupling device comprising a first inductive coupling structure, wherein the first inductive coupling structure comprises a plurality of separate conductors including a first and a second conductor, wherein the first conductor runs approximately parallel to the second conductor and within a first plane approximately parallel to a coupling plane, wherein the coupling device further comprises a second inductive coupling structure having a plurality of separate conductors including a first and a second conductor, wherein the first and second conductors of said second inductive coupling structure lie within a second plane approximately parallel to the coupling plane.

2. The inductive coupling device according to claim 1 wherein the conductors of the second inductive coupling structure are woven through the conductors of the first inductive coupling structure.

3. The inductive coupling device according to claim 1 wherein the coupling device further comprises an impedance matching circuit electrically connected to the conductors of the first and second inductive coupling structures.

4. A method of varying a field profile used to generate a plasma within a gas, the method comprising the steps of:

providing a planar conductor inductive coupling structure having a first and a second conducting path;

determining a desired field profile to be generated in an adjacent gas; and positioning the first conducting path relative to the second conducting path so as to obtain the desired field profile.

5. The method according to claim 4 wherein the step of positioning comprises the step of spacing the first and second conducting paths within a coupling plane to achieve the desired field profile.

6. The method according to claim 4 wherein the step of positioning comprises the steps of:

placing the first and second conducting paths at a desired spacing within a plane; and moving the second conducting path in a direction orthogonal to the plane to achieve the desired field profile.

\* \* \* \* \*